(12) United States Patent
Forrest et al.

(10) Patent No.: US 8,927,319 B2
(45) Date of Patent: Jan. 6, 2015

(54) METHODS OF PREPARING FLEXIBLE PHOTOVOLTAIC DEVICES USING EPITAXIAL LIFTOFF, AND PRESERVING THE INTEGRITY OF GROWTH SUBSTRATES USED IN EPITAXIAL GROWTH

(71) Applicant: The Regents of the University of Michigan, Ann Arbor, MI (US)

(72) Inventors: Stephen R. Forrest, Ann Arbor, MI (US); Jeramy Zimmerman, Ann Arbor, MI (US); Kyusang Lee, Ann Arbor, MI (US); Kuen-Ting Shiu, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 44 days.

(21) Appl. No.: 13/750,660

(22) Filed: Jan. 25, 2013

(65) Prior Publication Data

US 2013/0237001 A1 Sep. 12, 2013

Related U.S. Application Data

(62) Division of application No. 12/878,261, filed on Sep. 9, 2010, now Pat. No. 8,378,385.

(60) Provisional application No. 61/241,373, filed on Sep. 10, 2009, provisional application No. 61/241,374, filed on Sep. 10, 2009, provisional application No. 61/358,298, filed on Jun. 24, 2010.

(51) Int. Cl.
*H01L 31/18* (2006.01)
*H01L 21/78* (2006.01)
*H01L 31/0735* (2012.01)

(52) U.S. Cl.
CPC ........... *H01L 31/1892* (2013.01); *Y02E 10/544* (2013.01); *H01L 31/1896* (2013.01); *H01L 21/7813* (2013.01); *H01L 31/1852* (2013.01); *H01L 31/0735* (2013.01)

USPC .............. 438/64; 438/57; 438/457; 438/703; 438/253; 438/358; 257/190; 257/E21.214; 257/E29.024; 257/80

(58) Field of Classification Search
CPC ............ H01L 31/1852; H01L 21/7813; H01L 51/0016; H01L 21/31116; H01L 2221/6834; H01L 33/26
USPC ............. 438/64, 57, 457, 703, 253, 358, 199, 438/94; 357/190, E21.214, E29, 24, 80
See application file for complete search history.

(56) References Cited

U.S. PATENT DOCUMENTS

2002/0148113 A1 10/2002 Forrest et al.
2006/0054900 A1 3/2006 Takamoto et al.
(Continued)

FOREIGN PATENT DOCUMENTS

JP 08-288297 1/1996
JP 2005-019590 1/2005

OTHER PUBLICATIONS

International Search Report from corresponding PCT Application No. PCT/US2010/048213.
(Continued)

*Primary Examiner* — Cathy N Lam
(74) *Attorney, Agent, or Firm* — Finnegan, Henderson, Farabow, Garrett & Dunner LLP

(57) ABSTRACT

There is disclosed methods of making photosensitive devices, such as flexible photovoltaic (PV) devices, through the use of epitaxial liftoff. Also described herein are methods of preparing flexible PV devices comprising a structure having a growth substrate, wherein the selective etching of protective layers yields a smooth growth substrate that us suitable for reuse.

19 Claims, 34 Drawing Sheets

(56) References Cited

U.S. PATENT DOCUMENTS

| | | |
|---|---|---|
| 2008/0050858 A1 | 2/2008 | Ono et al. |
| 2009/0038678 A1 | 2/2009 | Pan et al. |
| 2009/0229659 A1 | 9/2009 | Wanlass et al. |
| 2010/0047959 A1 | 2/2010 | Cornfeld et al. |
| 2010/0171150 A1* | 7/2010 | Smith et al. .................. 257/194 |
| 2010/0316083 A1* | 12/2010 | Chang-Hasnain et al. 372/50.11 |

OTHER PUBLICATIONS

Van Geelen et al., "Epitaxial lift-off GaAs solar cell from a reusable GaAs substrate", Materials Science and Engineering B, Elsevier Sequoia, Lausanne, CH, vol. 45, No. 1-3, Mar. 1, 1997 (pp. 162-171), XP884883654.

Tatavarti, Rao, et al., Lightweight, Low Cost GaAs Solar Cells on 4" Epitaxial Liftoff (ELO) Wafers, IEEE (2008).

Yamaguchi, Hiroshi, et al., Development Status of "Space Solar Sheet", IEEE (2008).

Takamoto, Tatsuya, et al., Paper-Thin InGaP/GaAs Solar Cells, IEEE (2006).

Hageman, P.R., et al., Large Area, Thin Film Epitaxial Lift Off III/V Solar Cells, Proceedings from $25^{th}$ PVSC; May 13-17, 1996; Washington, D.C., IEEE (1996).

* cited by examiner

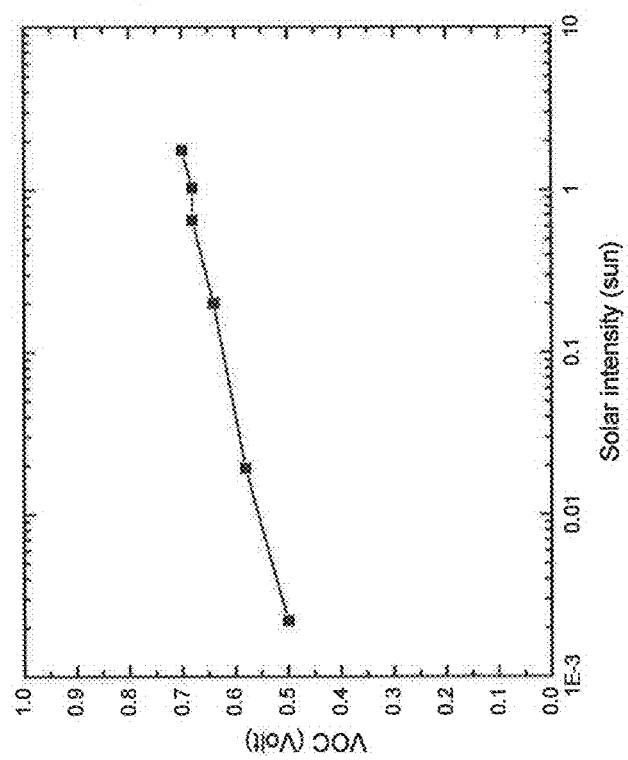
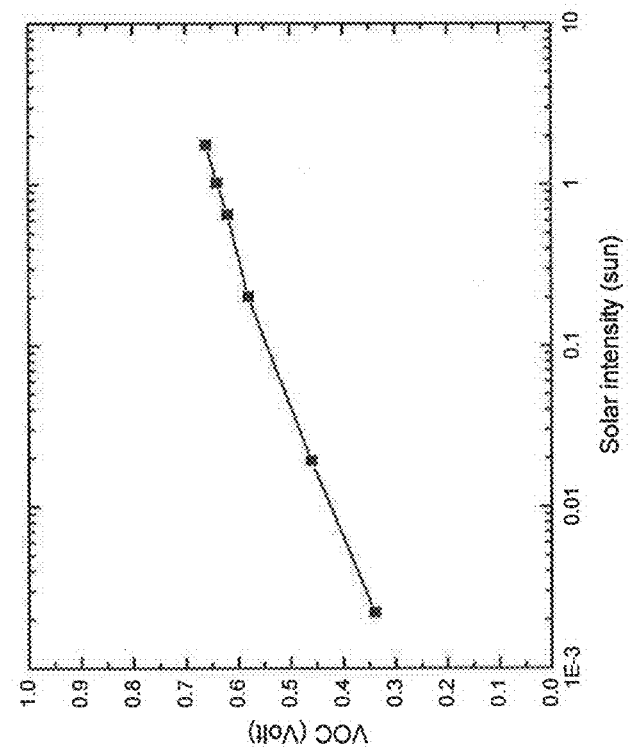
FIG. 6A
FIG. 6B

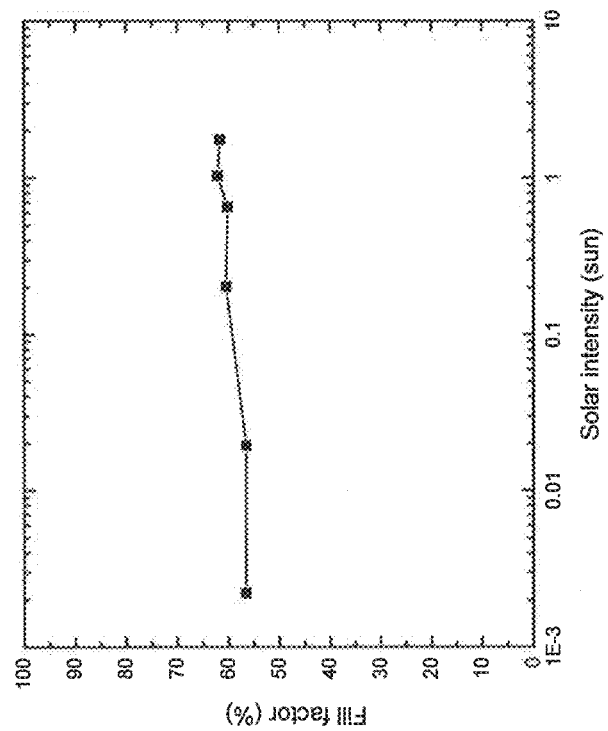
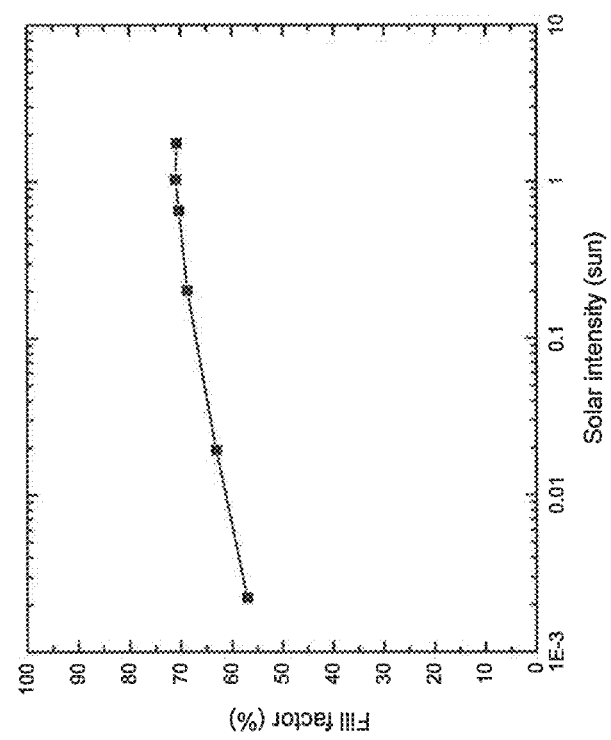
FIG. 7A
FIG. 7B

| Device structure | ITO/InP on 25μm thick Kapton foil (FIG. 8B) | CIGS on 12.5μm thick Upilex foil | CdTe on 10μm thick Upilex foil | GaAs thin-film on 3-mil thick glass |
|---|---|---|---|---|
| Power conversion efficiency | 10.2±1.0% | 14.1% | 11.4% | 19.2% |
| Specific Power (kW/kg) | 2.0±0.2 | 3.3[a] | 2 | 1.1 |
| $V_{oc}$ at 1 sun (V) | 0.62 | 0.649 | 0.765 | 1.0 |
| $J_{sc}$ at 1 sun (mA/cm$^2$) | 29.6±2.9 | 31.5 | 20.9 | 31.8 |
| Fill factor | 0.546 | 0.691 | 0.71 | 0.806 |

FIG. 19

METHODS OF PREPARING FLEXIBLE PHOTOVOLTAIC DEVICES USING EPITAXIAL LIFTOFF, AND PRESERVING THE INTEGRITY OF GROWTH SUBSTRATES USED IN EPITAXIAL GROWTH

CROSS-REFERENCE TO RELATED APPLICATION

This application is a divisional of, and claims the benefit of priority to, application Ser. No. 12/878,261, filed Sep. 9, 2010, which claims the benefit of U.S. Provisional Application No. 61/241,373, filed Sep. 10, 2009, U.S. Provisional Application No. 61/241,374, filed Sep. 10, 2009, and U.S. Provisional Application No. 61/358,298, filed Jun. 24, 2010. The contents of all four applications are incorporated herein by reference.

STATEMENT REGARDING FEDERALLY SPONSORED RESEARCH

This invention was made with U.S. Government support under award number W911 NF-08-2-0004, awarded by the U.S. Army Research Laboratory, and DE-SC0001013 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

FIELD OF THE DISCLOSURE

The present disclosure generally relates to methods of making photosensitive devices, such as flexible photovoltaic devices, through the use of epitaxial liftoff. In particular, the disclosure relates to methods for preparing flexible photovoltaic devices through epitaxial growth and preserving the integrity of growth substrates for reuse.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max} V_{max}\} / \{I_{SC} V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = ff^*(I_{SC} * V_{OC}) / P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. High-efficiency PV devices are typically produced on expensive, single crystal growth substrates. These growth substrates may include single crystal wafers, which can be used for creating a perfect lattice and structural support for the epitaxial growth of active layers, also known as "epilayers." These epilayers may be integrated into PV devices with their original growth substrates intact. Alternatively, those epilayers may be removed and recombined with a host substrate.

In some instances, it may be desirable to transfer the epilayers to host substrates that exhibit desirable optical, mechanical, or thermal properties. For example, Gallium Arsenide (GaAs) epilayers may be grown on Silicon (Si) substrates. However, the electronic quality of the resulting material may be insufficient for certain electronic applications. Therefore, it may be desirable to preserve the high material quality of the lattice-matched epilayers, while allowing the integration of those epilayers into other substrates. This may be accomplished by a method known as epitaxial liftoff. In epitaxial liftoff processes, epilayers may be "lifted off" growth layers and recombined (e.g., bonded or adhered) to a new host substrate.

Although they may provide desirable epitaxial growth characteristics, typical growth substrates can be thick and create excess weight, and the resulting devices tend to be fragile and require bulky support systems. Epitaxial liftoff may be a desirable way to transfer epilayers from their growth substrates to more efficient, light-weight, and flexible host substrates. Given the relative scarcity of typical growth substrates and the desirable characteristics that they impart on resulting cell structures, it may be desirable to recycle and/or reuse growth substrates in subsequent epitaxial growths. However, prior attempts to reuse growth wafers have either resulted in reduced efficiency or required abrasive "polishing" of the wafer by removing the top several micrometers of material from the wafer.

U.S. Patent Publication No, 2010/0047959 describes a method for selectively freeing an epitaxial layer from a single crystal substrate. The described method includes the deposition of a first buffer layer, an etch stop layer, a second buffer layer, and a separation layer. Above the separation layer, a sequence of semiconductor layers is deposited to form a cell. The method then comprises etching the separation layer, whereby semiconductor layers are pulled away from substrate and the associated buffer layers and etch stop layer. However, the specification does not describe a method of preparing the liberated substrate for reuse, such as, for example, selectively etching away the buffer layers and/or etch stop layers. Accordingly, there remains a need to develop methods that preserve the integrity of growth substrates for reuse.

SUMMARY

The present disclosure addresses the need to further develop more efficient, light weight, and flexible PV devices. The present disclosure also addresses the need to develop methods of non-destructively removing epitaxial growth layers from a growth substrate, and preserving the integrity of the growth substrate for reuse without the requirement of polishing or other destructive methods of preparing its surface prior to its next use. In some cases, this objective may be accomplished by transferring active epilayers from structures comprising growth substrates to lighter, flexible host substrates. In certain instances, the methods for effecting epilayer transfer may include the use of epitaxial liftoff methods comprising the selective etching of a sacrificial layer, followed by the selective etching of two or more protective layers.

In some embodiments, the optoelectronic devices described herein, such as flexible PV devices, may be prepared through the transfer of an epilayer from a pre-existing structure having a growth substrate. In some embodiments, the devices described herein may be prepared by first growing an epilayer on a growth substrate.

Thus, there is disclosed a method comprising:
providing a structure having a growth substrate and an epilayer;
depositing at least one metal or alloy on at least a portion of the epilayer to form a contact layer;
bonding the contact layer to a metal or alloy-coated host substrate; and
releasing the epilayer from the structure.

In one embodiment the method comprises:
growing an epilayer on a growth substrate;
depositing at least one metal or alloy on at least a portion of the epilayer to form a contact layer;
bonding the contact layer to a metal or alloy-coated host substrate; and
releasing the epilayer from the structure.

In one embodiment the method comprises:
providing a structure having a growth substrate and an epilayer;
patterning at least one top contact on the epilayer;
affixing the epilayer to a carrier substrate;
releasing the epilayer from the growth substrate;
depositing at least one metal or an alloy on at least a portion of the epilayer to form a contact layer;
bonding the epilayer to a metal or alloy-coated host substrate; and
removing the carrier substrate from the epilayer.

In another embodiment the method comprises:
growing an epilayer on a growth substrate;
patterning at least one top contact on the epilayer;
affixing the epilayer to a carrier substrate;
releasing the epilayer from the growth substrate;
depositing at least one metal or alloy on at least a portion of the epilayer to form a contact layer;
bonding the epilayer to a metal or alloy-coated host substrate; and
removing the carrier substrate from the epilayer.

In another embodiment, there is disclosed a method of preserving the smoothness of a growth substrate after the release of an epilayer by epitaxial liftoff, thus allowing the substrate to be used multiple times. In some embodiments, the method comprises the removal of an epilayer from a structure having multiple (e.g., such as at least three), sacrificial layers and a growth substrate, wherein the first sacrificial layer is etched to release the epilayer from the structure, and the second and third layers are etched to yield the smooth growth substrate. In some embodiments, the growth substrate may be suitable for reuse.

In one embodiment, the multiple layers include a "dummy layer" comprising the same material as the substrate, such as of GaAs, and a buffer layer, such as of InGaP, along with the usual sacrificial layer (e.g., AlAs) that is etched to remove GaAs solar cell from the original substrate.

When the substrate is InP, the dummy layer comprises InP, and a InGaAs buffer layer before the InP substrate. In both cases, the etchant used to remove the solar cell from the substrate, only damages the dummy layer, but this dummy layer, along with the buffer layer, are easily removed by etching then away from the original substrate. Thus, the original substrate can be reused.

In one embodiment, a method of preserving the integrity of a growth substrate is described, comprising:
providing a structure having a growth substrate with at least one growing surface; a cell; a sacrificial layer; a first protective layer; and a second protective layer, wherein the sacrificial layer and the first and second protective layers are positioned between the growth substrate and the cell;
releasing the cell by etching the sacrificial layer with an etchant;
removing the second protective layer by etching the second protective layer with an etchant; and
removing the first protective layer by etching the first protective layer with an etchant.

In one embodiment, the structure further comprises a buffer layer positioned between the growth substrate and the first protective layer.

In one embodiment, a method of preserving the integrity of a growth substrate is described, comprising:
providing a growth substrate with at least one growing surface;
depositing a first protective layer, a second protective layer, a sacrificial layer, and a cell over the growth substrate, wherein the sacrificial layer and the first and second protective layers are positioned between the growth substrate and the cell;
releasing the cell by etching the sacrificial layer with an etchant;
removing the second protective layer by etching the second protective layer with an etchant; and
removing the first protective layer by etching the first protective layer with an etchant.

In one embodiment, the method further comprises depositing a buffer layer, wherein the buffer layer is positioned between the growth substrate and the first protective layer.

In one embodiment, a method of preparing a PV device is described, comprising:
providing a growth substrate;
depositing a first protective layer, a second protective layer, a sacrificial layer, and at least one epilayer over the growth substrate, wherein the sacrificial layer and the first and second protective layers are positioned between the growth substrate and the sacrificial layer, and the sacrificial layer is positioned between the growth substrate and the epilayer;
depositing at least one metal or alloy on at least a portion of said epilayer to form a contact layer;
bonding the contact layer to a metal or alloy-coated host substrate; and
releasing the at least one epilayer by etching the sacrificial layer with an etchant.

In one embodiments, the method further comprises depositing a buffer layer, wherein the buffer layer is positioned between the growth substrate and the first protective layer.

In one embodiment, a growth structure is described, comprising:
a growth substrate, a sacrificial layer, a buffer layer, a first protective layer, a second protective layer, a third protective layer, a fourth protective layer, at least one epilayer, at least one contact, and a metal or alloy-coated host substrate,
wherein the sacrificial layer is positioned between the growth substrate and the at least one epilayer, the first and second protective layers are positioned between the growth substrate and the sacrificial layer, and the third and fourth protective layers are positioned between the sacrificial layer and the epilayer.

The foregoing and other features of the present disclosure will be more readily apparent from the following detailed description of exemplary embodiments, taken in conjunction with the attached drawings. It will be noted that for convenience all illustrations of devices show the height dimension exaggerated in relation to the width.

BRIEF DESCRIPTION OF THE DRAWINGS

FIG. 6A represents the open voltage circuit (VOC) versus light intensity (sun) for the control device of FIG. 4A.

FIG. 6B represents the open voltage circuit (VOC) versus light intensity (sun) for the flexible PV device of FIG. 4B FIG. 7A represents the fill factor (%) versus light intensity (sun) for the control device of FIG. 4A.

FIG. 7B represents the fill factor (%) versus light intensity (sun) for the flexible PV device of FIG. 4B.

FIG. 19 compares the performance of a flexible PV device represented by FIG. 8D with different devices.

Inset: The 2× and 4× surface reconstruction patterns obtained by reflection high-energy electron diffraction for the fresh and the ELO-processed substrate after eliminating oxide layer.

Figure 31:
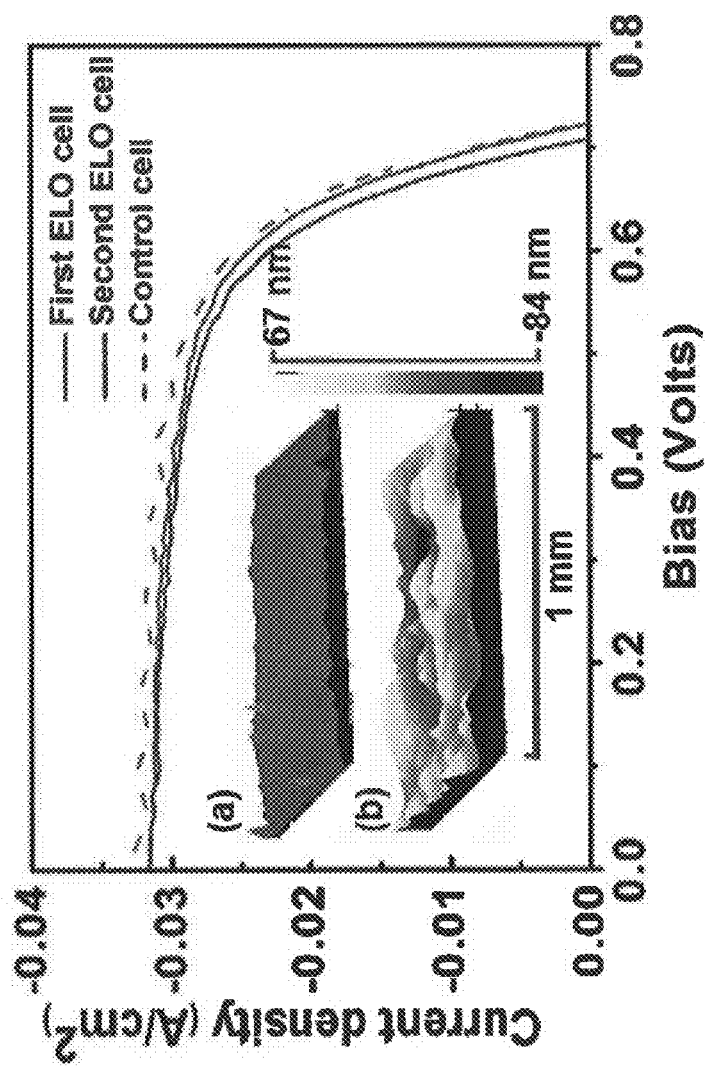

FIG. 31 represents the current density (A/cm$^2$) versus bias (Volts) after ELO of the first and second devices in FIG. 7A as compared to a control cell bonded to Kapton® sheet, and measured under 1 sun, AM1.5G simulated solar illumination.

Inset: Surface morphology of the original substrate (a) after ELO and protection layer removal and (b) after the ELO without the protection layer.

DETAILED DESCRIPTION

The photosensitive devices described herein include, but are not limited to, solar cells, photodetectors, photosensors, photoconductors, chemical sensors, and biological sensors. Exemplary photosensitive devices include PV cells and/or devices. Also described herein are methods for preparing the same, including the growth of epitaxial layers on a growth substrate and removal the resulting cell from the growth substrate, wherein the integrity of said substrate is preserved for subsequent reuse.

As used herein, the term "layer" refers to a member or component of a photosensitive device whose primary dimension is X-Y, i.e., along its length and width, and is typically perpendicular to the plane of incidence of the illumination. It should be understood that the term "layer" is not necessarily limited to single layers or sheets of materials. A layer can comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, the term "III-V material" may be used to refer to compound crystals containing elements from group WA and group VA of the periodic table. More specifically, the term III-V material may be used herein to refer to compounds which are combinations of the group of Gallium (Ga), Indium (In) and Aluminum (Al), and the group of Arsenic (As), Phosphorous (P), Nitrogen (N), and Antimony (Sb). Representative materials may include GaAs, InP, InGaAs, AlAs, AlGaAs, InGaAsP, InGaAsPN, GaN, InGaN, InGaP, GaSb, GaAlSb, InGaTeP, and InSb and all related compounds. The term "Group IV" comprises such semiconductors as Si and Ge in column IV of the periodic chart. Group II-VI comprises such semiconductors as CdS and CdTe, for example, that reside in Groups II and VI of the periodic chart. It is understood that the methods described herein can apply to all of these common classes of semiconductors.

As stated, the flexible photovoltaic devices described herein may be prepared by first providing a pre-existing structure having an epilayer and a growth substrate, or by first growing an epilayer on a growth substrate. Upon doing so, the flexible PV device may then be prepared by:

depositing at least one metal or alloy on at least a portion of said epilayer to form a contact layer;

bonding the contact layer to a metal or alloy-coated host substrate; and releasing the epilayer from said structure.

Figure 1:
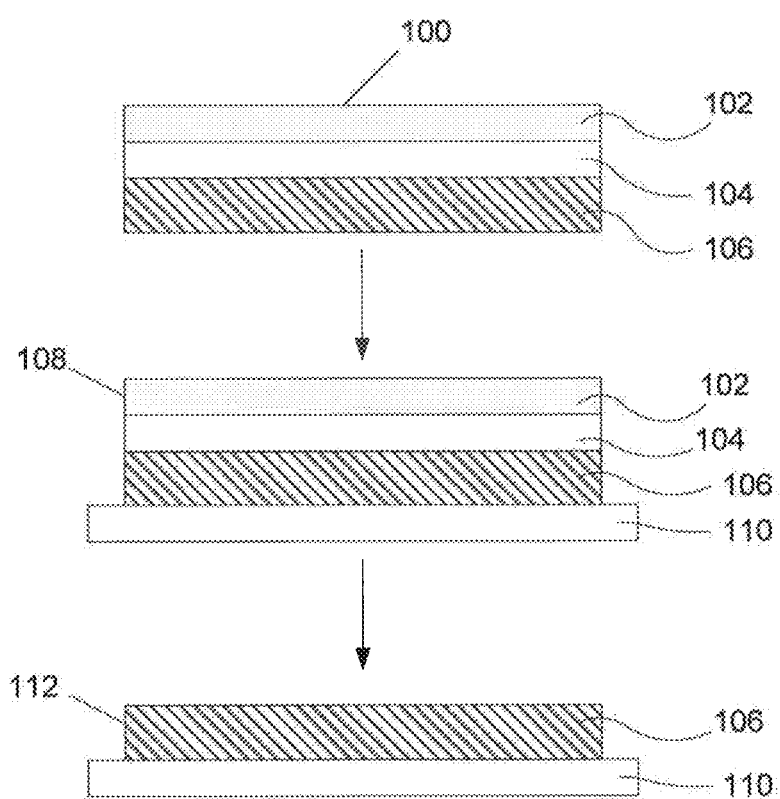
FIG. 1 is a schematic drawing of a device, in cross-section, illustrating different methods of preparing flexible PV devices consistent with the embodiments described herein.

FIG. 1 illustrates a schematic for the preparation of certain PV devices, such as flexible PV cells. The Figures, and the relative sizes/depths of certain materials and layers, are not necessarily drawn to scale. The method of FIG. 1, which may be referred to as the "single flip" method, can be initiated through the selection of device 100. Device 100 may include growth substrate 102 and epilayer 106. In some embodiments, device 100 may further include release layer 104. In the alternative, device 100 may be prepared by growing epilayer 106 on growth substrate 102. Suitable growth methods may include, for example, gas source molecular beam epitaxy, MOCVD (metallo-organic Chemical vapor deposition)/MOVPE (metalo-organic vapor phase Epitaxy), HVPE (hydride vapor phase Epitaxy), solid source MBE, and Chemical beam epitaxy.

In some embodiments, epilayer 106 may comprise any active material that may be desirable for use in PV devices. Depending on the nature of the material, the PV active layers may exhibit different characteristics and/or levels of performance. Table 1 compares the efficiencies and outputs of PV cells comprising different active layers.

TABLE 1

| Material | Max efficiency | Cell thickness | Watts/gram supported* | Watts/gram active* |
|---|---|---|---|---|
| GaAs | 26% | 2 µm | 6.0 | 25 |
| III-V multi-junction** | 33% | 12 µm | 3.4 | 5.2 |
| CIGS | 19% | 5 µm | 3.3 | 7.6 |
| CdTe | 16% | 5 µm | 2.6 | 5.4 |
| Amorphous silicon | 12% | 10 µm | 2.2 | 5.2 |
| Organics | 5% | <1 µm | 1.5 | >30 |

TABLE 1-continued

| Material | Max efficiency | Cell thickness | Watts/ gram supported* | Watts/ gram active* |
|---|---|---|---|---|
| III-V multi-junction† | 33% | 162 μm | <0.3†† | 0.4 |
| Crystalline Silicon | 25% | 145 μm | <0.4†† | 0.7 |

*Assumes cell is illuminated with AM1.5 radiation at 1000 W/m², and is mounted on 25 μm Kapton or Mylar sheet, Active weight includes contacts such as ITO, Al, etc
**without concentration, substrate removed
†without concentration on 150 um Ge substrate
††not flexible and requires bulky support for the substrate In some embodiments, epilayer 106 may be selected from at least one III-V material. GaAs, InP, and other III-V compounds may be attractive electronic materials for various types of optoelectronic devices, including PV devices. In general, certain III-V compounds may have favorable piezoelectric and optoelectronic properties, high piezoelectric constants, and wide electronic bandgaps (relative to Si). In some embodiments, the favorable characteristics of certain epilayers may allow for the production of thin, lightweight PV devices. In some embodiments, the resulting PV devices may exhibit a thickness from only a few micrometers thick to several hundred micrometers thick. Exemplary devices may exhibit final thicknesses that include, but are not limited to, about 10 μm to about 150 μm, about 25 μm to about 30 μm, about 10 μm to about 25 μm, and, in some instances, less than 10 μm. In addition, some III-V materials may be deposited as ternary or quarternary "matched alloys" that have lattice constants closely matched to the binary compounds from which they are derived (e.g., $Al_xGa_{1-x}As$ and GaAs), thus permitting the fabrication of a wide variety of heterostructures that facilitate device performance. Matched alloys of InP may include compounds such as InGaAs, InAlAs, InGaAsP, and InGaAlAs.

Non-limiting examples of lattice matched compounds for GaAs include: $In_{0.5}Ga_{0.5}P$; $In_{0.5}Al_{0.5}P$; and any combination of these, including with GaAs, such as $(In_{0.5}Ga_{0.5}P)_X(In_{0.5}Al_{0.5}P)_{1-X}$ and $(In_{0.5}Ga_{0.5}P)_X(GaAs)_{1-X}$, which are often shortened to InGaAsP, InGaPAs, GaInAsP. The same names would follow for the following two compounds: $(In_{0.5}Al_{0.5}P)_X(GaAs)_{1-X}$ and $(In_{0.5}Ga_{0.5}P)_Y(In_{0.5}Al_{0.5}P)_X(GaAs)_{1-X-Y}$.

Also, Ge is nearly matched and is often used as a substrate, but layers of it are generally not grown on GaAs wafers.

Non-limiting examples of lattice matched compounds for InP include: $In_{0.53}Ga_{0.47}As$; $In_{0.52}Al_{0.48}As$; $GaAs_{0.5}Sb_{0.5}$; $AlAs_{0.5}Sb_{0.5}$ and any combination of the above, including with InP, such as $(In_{0.53}Ga_{0.47}As)_X(In_{0.52}Al_{0.48}As)_{1-X}$; $(In_{0.53}Ga_{0.47}As)_X(In_{0.52}Al_{0.48}As)_Y(InP)_{1-X-Y}$; $(In_{0.53}Ga_{0.47}As)_W(In_{0.52}Al_{0.48}As)_X (GaAs_{0.5}Sb_{0.5})_Y (AlAs_{0.5}Sb_{0.5})_Z(InP)_{1-W-X-Y-Z}$.

In one embodiment, dilute nitrides can be used by adding small amounts of nitrogen (0-5%) to the compounds. In this embodiment, some other materials should be added to maintain lattice matching, such as In or Sb. This could be useful for creating a lower bandgap material while being lattice matched.

Epilayer 106 may also comprise a "stack" of different materials. For example, in some embodiments, epilayer 106 may comprise a stack of different III-V materials. Exemplary stacks may include InGaAs/InP, InGaAs/InP/InGaAs, GaAs/InGaP, InP/InGaAlAs, GaAs/InGaAs, AlGaAs/GaAs, InP/InGaAs/InGaAs, InP/InP/InAlAs, and InP/GaAs/InGaAs. Exemplary stacks may also include "super lattices" of alternating layers. An exemplary super lattice may include alternating layers of InAs/AlAs.

Further, epilayer 106 may be deposited as lattice-mismatched layers, also known as "strained layers." Lattice-mismatched materials may show different growth modes as compared to such lattice-matched materials as GaAs/AlGaAs. An exemplary latticed-mismatched layer may include InAs on GaAs.

In some embodiments, epilayer 106 may be doped. Suitable dopants may include, but are not limited to, Beryllium (Be), Mg (and other group IIAs), Zn, Cd, Hg, C, Si, Ge, Sn, O, S, Se, and Te. For example, epilayer 106 may comprise an InGaAs/InP or InGaAs/InP/InGaAs stack, wherein each of the stack materials are lightly doped with a dopant such as Be.

Growth substrate 102 may comprise any number of materials, including single crystal wafer materials. In some embodiments, growth substrate 102 may be selected from materials that include, but are not limited to, Germanium (Ge), Si, GaAs, InP, GaN, AlN, SiC, CdTe, sapphire, and combinations thereof. In some embodiments, growth substrate 102 comprises GaAs. In some embodiments, growth substrate 102 comprises InP. In some embodiments, the materials comprising growth substrate 102 may be doped. Suitable dopants may include, but are not limited to, Zinc (Zn), Mg (and other group IIA compounds), Zn, Cd, Hg, C, Si, Ge, Sn, O, S, Se, Te, Fe, and Cr. For example, growth substrate 102 may comprise InP doped with Zn and/or S. Unless otherwise indicated, it should be understood that reference to a layer comprising, e.g., InP encompasses InP in its undoped and doped (e.g., p-InP, n-InP) forms. Suitable dopant selections may depend, for example, on the semi-insulating nature of a substrate, or any defects present therein.

In some embodiments, release layer 104 may comprise an etch stop layer. In some embodiments, release layer 104 may be selected from any material suitable for use in epitaxial lifting processes, such as, but not limited to, AlGaAs, InGaAs/InAlAs, and InGaAs, AlAs, InGaP, InAlP, InGaAlAs and InP.

It should be understood that the certain release layers (e.g., etch stop layers) and/or release materials may be incorporated into epilayer 106 without making an express reference to a separate etch stop layer. For example, a device having a "GaAs/AlGaAs" structure may be referenced as single GaAs/AlGaAs epilayer stack. Alternatively, such a structure may be described as having more than one layer (e.g., a GaAs epilayer and an AlGaAs etch stop layer). Similarly, an "InGaAs/InP/InGaAs" structure may be described as an InGaAs/InP/InGaAs epilayer stack, or an InGaAs/InP epilayer stack and an InGaAs etch stop layer.

The specific arrangement of layers and materials illustrated in FIG. 1 is exemplary only, and is not intended to be limiting. For example, some layers (such as release layer 104) may be omitted. Other layers (such as polymer layers, junctions, and active layers) may be added. The order of the layers may be altered. Arrangements other than those specifically described may be used.

In the first step of the method illustrated in FIG. 1, a contact layer is deposited on the surface of epilayer 106 of device 100. Suitable contact layers include, but are not limited to, materials such as Gold (Au), Titanium (Ti), Platinum (Pt) and Germanium (Ge). In some embodiments, the contact layer is Au. Other suitable contact layers may include alloys and stacks of those materials. For example, the contact layer on epilayer 106 may comprise a Ti/Pt/Au or Ge/Au stack. The contact layer may be deposited on epilayer 106 using any number of suitable methods available in the field, including spincoating, dipcoating, spraycoating, chemical vapor deposition (CVD), pulsed laser deposition (PLD), and any physical vapor deposition method, such as sputtering, thermal evaporation, or E-beam evaporation.

Upon deposition of the contact layer to epilayer 106, epilayer 106 is bonded to host substrate 110 to form intermediate structure 108. In some embodiments, host substrate 110 may be coated with a material similar to that selected for the contact layer deposited on epilayer 106. Such a coating may be effective in aiding the bonding of epilayer 106 to host substrate 110. For example, the contact layer of epilayer 106 may comprise Au, while host substrate 110 is coated with Au. In some embodiments, suitable bonding techniques may include cold bonding, various gluing techniques, wax (e.g., black wax), photoresists, silver paint, anodic bonding, and other bonding techniques known in the art. In one embodiment, cold bonding may comprise cold-welding. In cold-welding, by simply applying a little pressure, contact between two metal layers form, and eventually thus bond. A discussion of cold welding techniques according to the present disclosure is found in U.S. Pat. No. 6,895,667, which is herein incorporated by reference.

In an effort to create a flexible PV product, it may be desirable to transfer epilayer 106 to a thin and/or flexible host substrate. Therefore, in some embodiments, host substrate 110 may comprise at least one polymer. In some embodiments, the polymer may be selected from polyesters and polyimides. In some embodiments, suitable polyesters may include polyethylene terephthalate. Non-limiting examples of commercial polyesters that may be used include Mylar®. Non-limiting examples of commercial polyimides that may be used include Kapton®.

Once intermediate structure 108 has been formed, epilayer 106 may be removed from growth substrate 102. In some embodiments, the removal of growth substrate 102 from intermediate structure 108 may be accomplished by using an etchant such as HF. Other suitable etchants may include phosphoric acid ($H_3PO_4$), hydrochloric acid (HCl), sulfuric acid ($H_2SO_4$), hydrogen peroxide ($H_2O_2$ and combinations thereof. For example, suitable etchant combinations may include $H_3PO_4$:HCl and $H_2SO_4$:$H_2O_2$:$H_2O$, and HF:$H_2O_2$:$H_2O$. In some embodiments, intermediate structure may further comprise release layer 104. Release layer 104 may comprise certain etch stop materials, whereby epilayer 106 is separated from growth substrate 102 via the lateral etching of release layer 104.

The removal of growth substrate 102 will yield device 112. Upon removal of growth substrate 102, a top contact may be patterned on the exposed surface of epilayer 106. Suitable top contacts may include, but are not limited to, oxides such as tin oxide (TO), gallium indium tin oxide (GITO), zinc oxide (ZO), indium zinc oxide (IZO), zinc indium tin oxide (ZITO), and aluminum zinc oxide (AlZnO), nickel oxide (NiO), and carbon nanotubes (CNTs). In some embodiments, the oxides may be doped. In some embodiments, a transparent substrate and resistive electrode combination may be used, such as a commercially available ITO (contact) deposited on glass or plastic. In some embodiments, the contact is ITO.

If materials such as polyesters (e.g., Mylar®) and polyimides (e.g., Kapton®) are selected for host substrate 110, resulting device 112 may represent a light, flexible PV cell that is suitable for simplified methods of storage, transport, and deployment. The use of such materials can also reduce the weight of the resulting cells and create PV devices with large Watt/gram ratios, which may be useful for space applications and other weight-restricted technologies such as unmanned aerial vehicles (UAVs).

As stated, in an alternate embodiment, the flexible PV devices described herein may be prepared by first providing a pre-existing structure having an epilayer and a growth substrate, or by first growing an epilayer on a growth substrate. Upon doing so, the flexible PV device may then be prepared by patterning at least one top contact on the epilayer;
affixing the epilayer to a carrier substrate;
releasing the epilayer from the growth substrate;
depositing at least one metal or alloy on at least a portion of the epilayer to form a contact layer;
bonding the epilayer to a metal or alloy-coated host substrate; and
removing the carrier substrate from the epilayer.

In yet another alternative embodiment, the patterning step may instead take place last (e.g., after the removing step), such that the first step of the process comprises the affixing of the epilayer to a carrier substrate.

Figure 2:
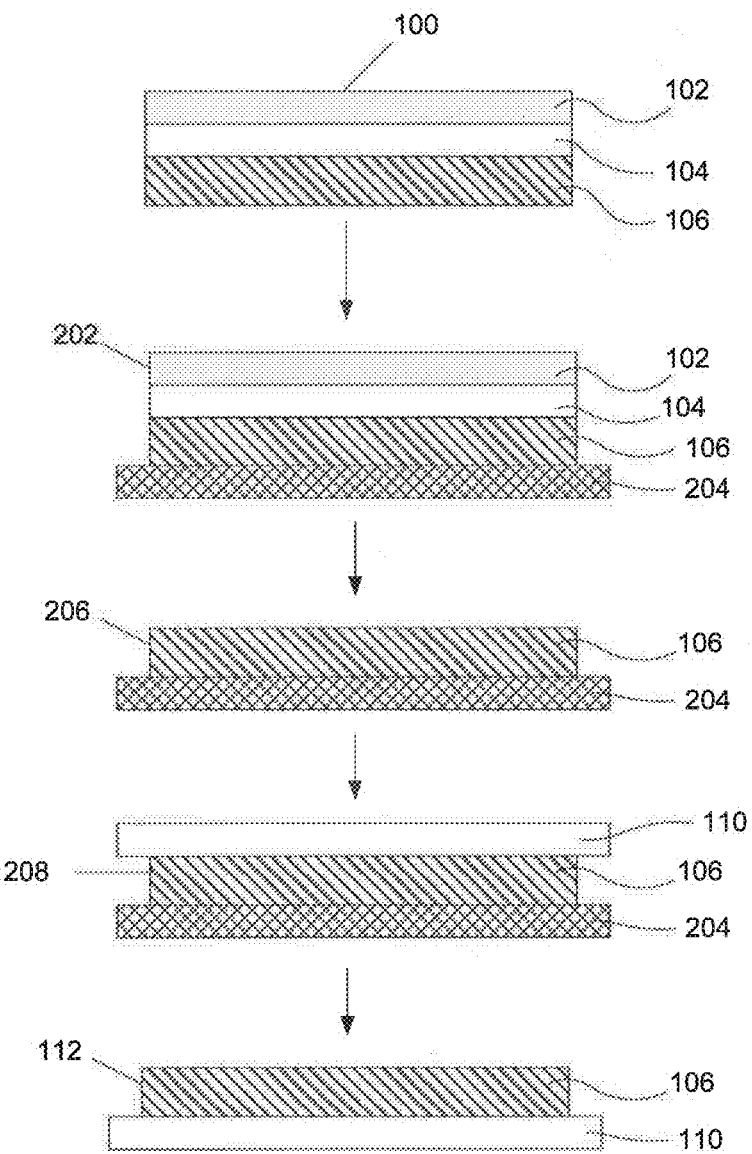
FIG. 2 is a schematic drawing of a device, in cross-section, according to the present disclosure illustrating additional methods of preparing flexible PV devices consistent with the embodiments described herein.

Like FIG. 1, FIG. 2 illustrates a schematic for the preparation of certain PV devices. The method of FIG. 2 outlines what may be referred to as the "double flip" method. Similar to FIG. 1, device 100 may include growth substrate 102 and epilayer 106. In some embodiments, device 100 may further include release layer 104. Unless otherwise indicated, suitable materials for the methods outlined in FIG. 2 may include those described above with respect to FIG. 1.

In the first step of FIG. 2, device 100 is provided. Device 100 may be a pre-existing optoelectronic device. In the alternative, device 100 may be prepared by growing epilayer 106 on growth substrate 102, which may be performed by any suitable method, including those discussed above.

Next, a top contact may be patterned on epilayer 106 of device 100. Epilayer 106 may then be affixed to carrier substrate 204 to form intermediate structure 202. In some embodiments, carrier substrate 204 may comprise a wafer material, such as a single-crystal wafer. In some embodiments, carrier substrate 204 may comprise a non-wafer substrate. For example, carrier substrate 204 may comprise a waxy substrate such as black wax. In some embodiments, device 100 may be affixed to carrier substrate 204 through the use of at least one bonding agent. In some embodiments, the at least one bonding agent may be selected from suitable waxes and soluble glues, such as, but not limited to, various photoresists, black wax, and paraffins.

Once intermediate structure 202 has been formed, epilayer 106 may be removed from growth substrate 102 to form intermediate structure 206. In some embodiments, the removal of growth substrate 102 may be done in a manner similar to that described above with respect to FIG. 1. Upon formation of intermediate 206, the patterned top contact is located between epilayer 106 and carrier substrate 204. A contact layer may then be deposited on the exposed surface of epilayer 106.

In the next step, epilayer 106 of intermediate structure 206 may be bonded to host substrate 110 to form intermediate structure 208. Like the methods disclosed in FIG. 1, host substrate 110 in FIG. 2 may include a coating that comprises a material similar to that of the contact layer deposited on epilayer 106. This may aid the in the bonding of host substrate 110 to epilayer 106, which may be effected through known methods such as cold bonding, various gluing techniques, wax (e.g., black wax), photoresists, silver paint, anodic bonding, and other bonding techniques known in the art.

Upon the formation of intermediate structure 208, carrier substrate 204 may then be removed by using known methods, such as heating (to melt wax), or dissolving wax in a solvent (e.g. acetone), to yield device 112.

Figure 3:
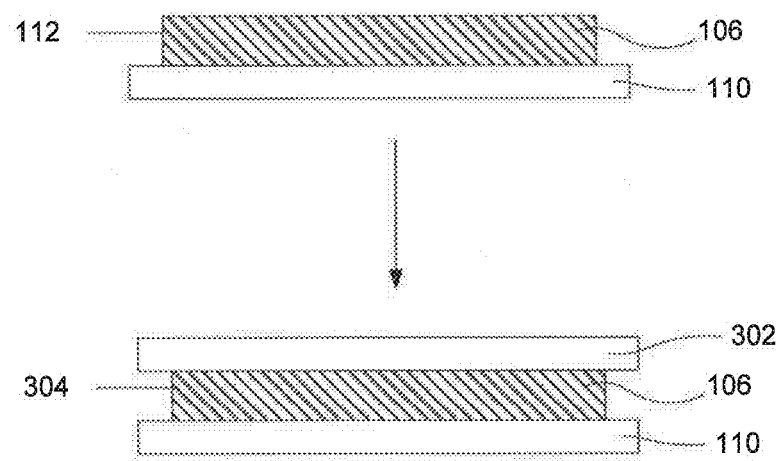
FIG. 3 is a schematic drawing of a device, in cross-section, according to the present disclosure illustrating additional methods of preparing flexible PV devices consistent with the embodiments described herein.

In some embodiments, it may be desirable to add additional layers to the devices prepared through the methods depicted in FIGS. 1 and 2. For example, it may be desirable to add additional layer(s) to epilayer 106 of device 112. FIG. 3 depicts the addition of layer 302 to epilayer 106 to form device 304. In some embodiments, layer 302 may represent a flexible material that complements the structural support provided by host substrate 110. Therefore, in some embodiments, layer 302 may represent a polymer. In some embodiments, both layer 302 and host substrate 110 may comprise polymeric materials. In some embodiments, the polymers may be independently selected from polyesters and polyimides. In some embodiments, suitable polyesters may include polyethylene terephthalate. In some embodiments, the polyester may comprise Mylar®. In some embodiments, the polyimide may comprise Kapton®.

Figure 22:
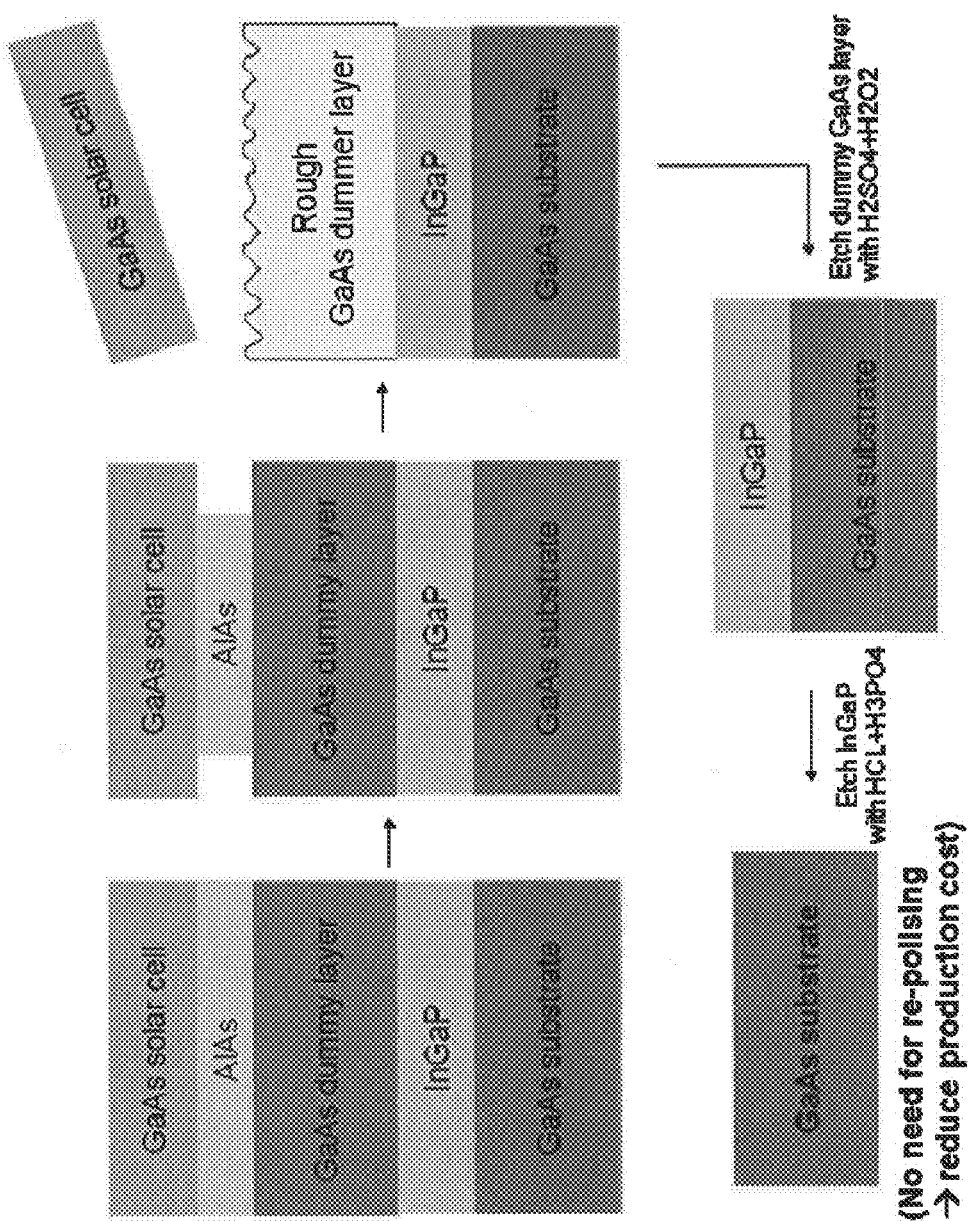
FIG. 22 exhibits an exemplary method for preserving the integrity of a GaAs substrate after epitaxial liftoff using an AlAs sacrificial layer.
Figure 23:
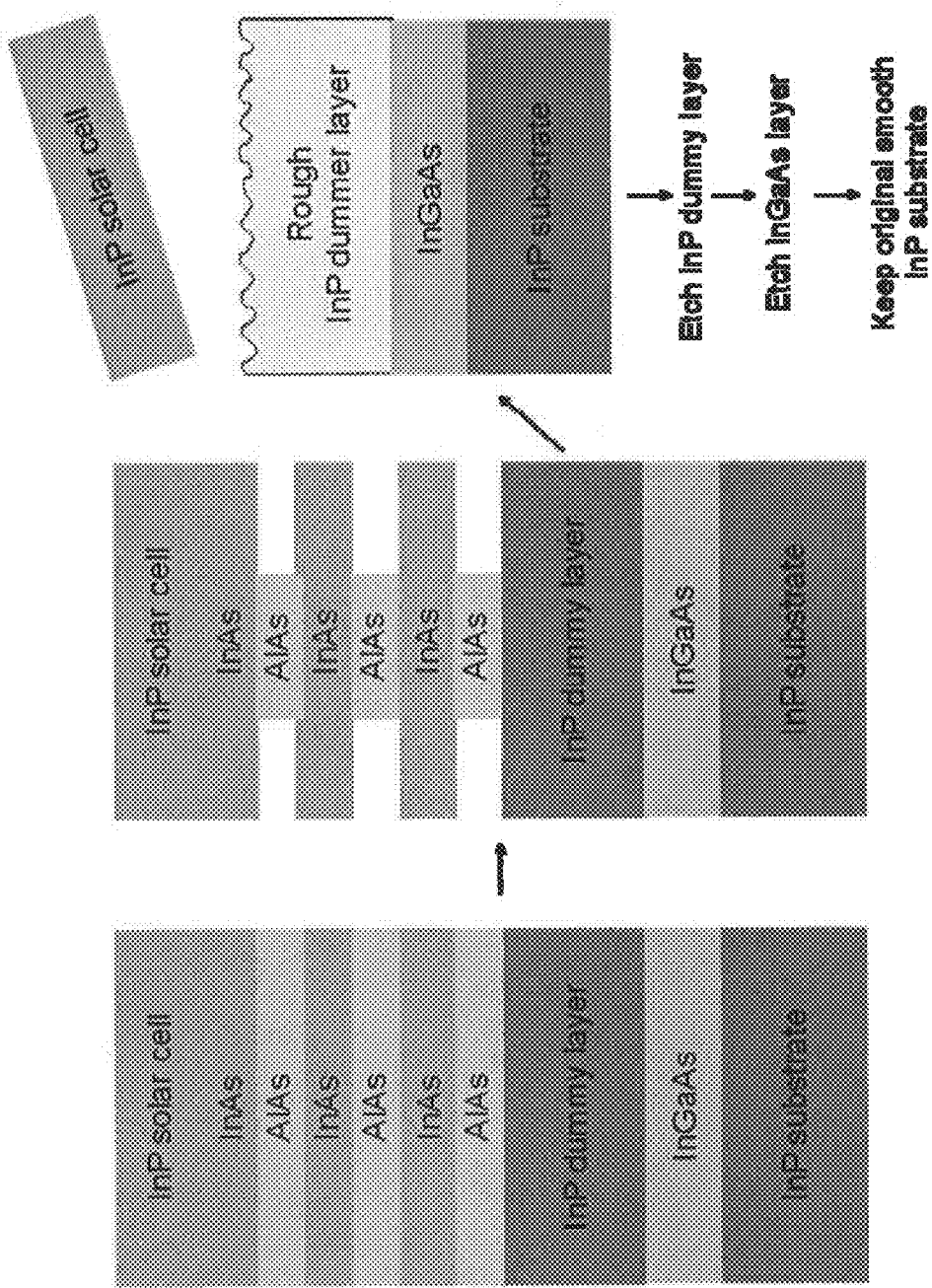
FIG. 23 exhibits an exemplary method for preserving the integrity of a InP substrate after epitaxial liftoff using a superlattice of InAs/AlAs as a sacrificial layer.

In yet another embodiment, there is disclosed a method of preserving the smoothness of a growth substrate after the release of an epilayer by epitaxial liftoff. Exemplary methods include those outlined in FIGS. 22 and 23. In some embodiments, the method comprises the removal of an epilayer from a structure having multiple, such as at least three, sacrificial layers and a growth substrate, wherein the first sacrificial layer is etched to release the epilayer from the structure, and the second and third layers are etched to yield the smooth growth substrate. In some embodiments, the second sacrificial layer may be referred to as a "dummy" layer. In other embodiments, it may be desirable to remove an epilayer from a structure having more than three sacrificial layers. For example, in some embodiments, the structure may comprise a super-lattice having multiple sacrificial layers that are removed in a first etch step, thereby resulting in the removal of the epilayer. Subsequent etch steps may be used to remove the additional sacrificial layers (e.g., dummy layer(s)) that were not removed in the first etch step, yielding a growth substrate exhibiting preserved smoothness and suitable for reuse. As used herein, the term "sacrificial layer" may be used to describe or refer to one or more release, dummy and/or protective layers.

As stated, the flexible PV devices and growth methods described herein may be achieved by first providing a preexisting structure having an epilayer and a growth substrate, or by first growing an epilayer on a growth substrate. Upon doing so, the growth substrate may be liberated for multiple reuses provided that the process for liberation is nondestructive of the underlying substrate, as is the purpose of this method. In some embodiments, the method comprises:

providing a structure having a growth substrate with at least one growing surface; a cell; a sacrificial layer; a first protective layer; and a second protective layer, wherein the sacrificial layer and the first and second protective layers are positioned between the growth substrate and the cell;

releasing the cell by etching the sacrificial layer with an etchant;

removing the second protective layer by etching the second protective layer with an etchant; and removing the first protective layer by etching the first protective layer with an etchant.

Figure 20:
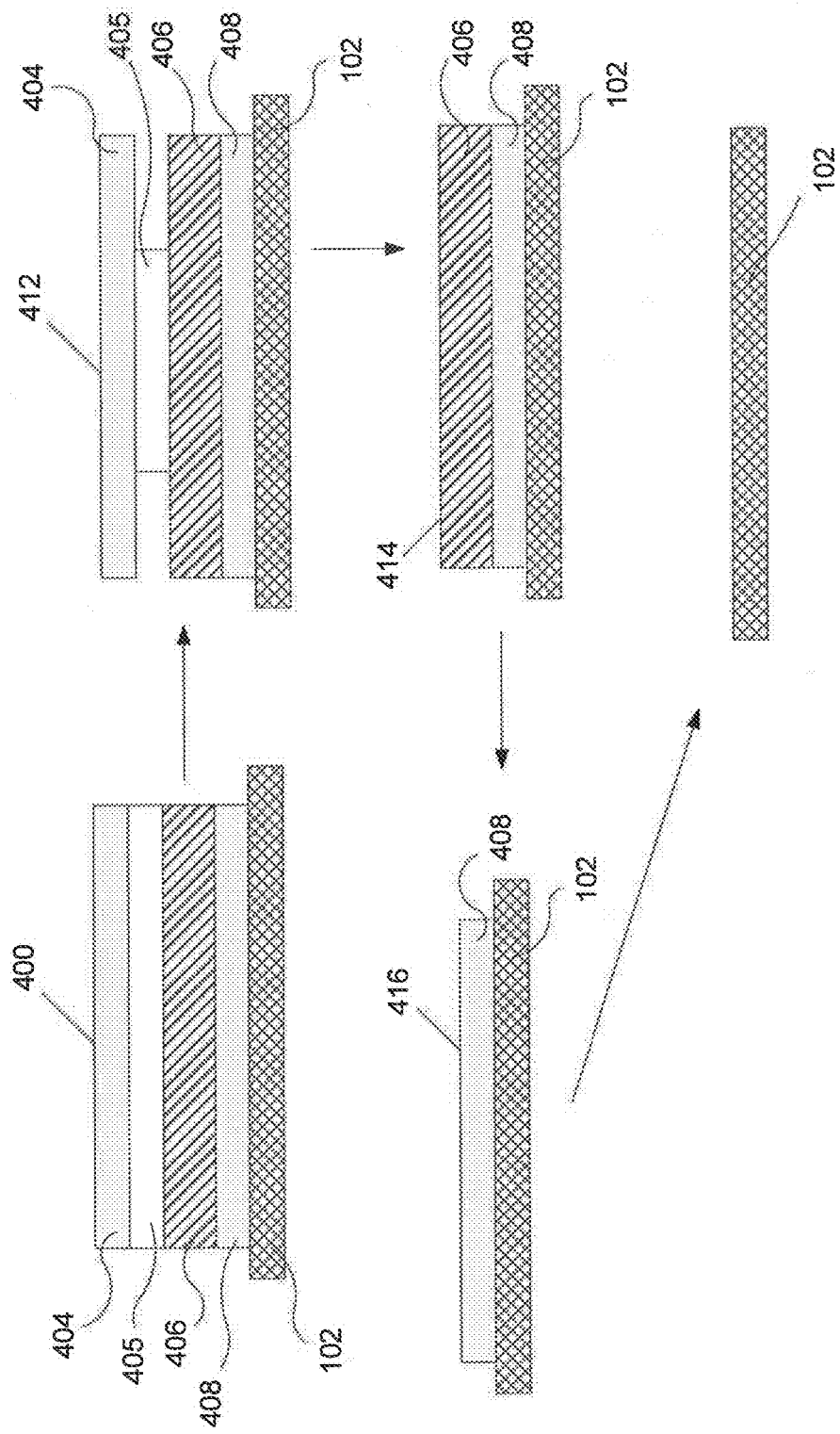
FIG. 20 is a schematic drawing of a structure, in cross-section, illustrating a method for removing a cell from a growth substrate consistent with the embodiments described herein.

FIG. 20 illustrates a schematic for the preparation of certain PV devices, which comprises the removal of the growth substrate from the overlying epilayer/cell structure. The method of FIG. 20 can be initiated through the selection of structure 400. Structure 400 may include growth substrate 102 and cell 404. It should be noted that cell 404 may represent a fully-developed cell after growth, comprising multiple layers such as epilayers of several different semiconductor alloys, contact layers, substrates, and intermediate layers. It should also be understood that cell 404 may simply comprise one or more growth layers, such as a single epilayer comprising one or more of the suitable materials described above with respect to epilayer 106. In some embodiments, cell 404 is a PV cell structure comprised of the optically and electrically active semiconductor layers required to covert light to electricity.

Growth substrate 102 may comprise any number of materials, including single crystal wafer materials. In some embodiments, growth substrate 102 may be selected from materials described above.

Structure 400 further comprises sacrificial layer 405, first protective layer 408, and second protective layer 406. In some embodiments, growth substrate 102 and second protective layer 406 comprise the same material. Those materials may be selected from, for example, GaAs and InP. In some embodiments, when the material is GaAs, first protective layer 408 may be selected from InGaP and AlGaAs. In some embodiments, when the material is InP, first protective layer 408 may comprise InGaAs. In some embodiments, it may be presumed that all epilayers are either lattice matched to the substrate, or are less than the critical thickness that introduces large numbers of dislocations or other morphological defects.

In some embodiments, structure 400 may further comprise at least one buffer layer positioned between first protective layer 408 and growth substrate 102. In some embodiments, growth substrate 102, second protective layer 406, and the buffer layer may comprise the same material, such as InP.

In some embodiments, the layers described herein may be doped. For example, reference to a layer comprising, e.g., InP should be presumed to encompass InP in its undoped and doped (e.g., p-InP, n-InP) forms. Suitable dopants may include, but are not limited to, p-type dopants of Beryllium (Be), Mg (and other group IIAs), Zn, Cd, ambipolar dopants C, Si, Ge, and n-type dopants Sn, S, Se, and Te.

The specific arrangement of layers and materials illustrated in FIG. 20 is exemplary only, and is not intended to be limiting. For example, some layers (such as the at least one buffer layer) may be omitted. Other layers (such as polymer layers, junctions, and active layers) may be added. The order of the layers may be altered. Arrangements other than those specifically described may be used.

In the first step of FIG. 20, structure 400, sacrificial layer 405 is exposed to an etchant, which begins to undergo etching to yield intermediate structure 412 having a partially-etched sacrificial layer 405. In some embodiments, sacrificial layer 405 comprises AlAs.

Figure 21:
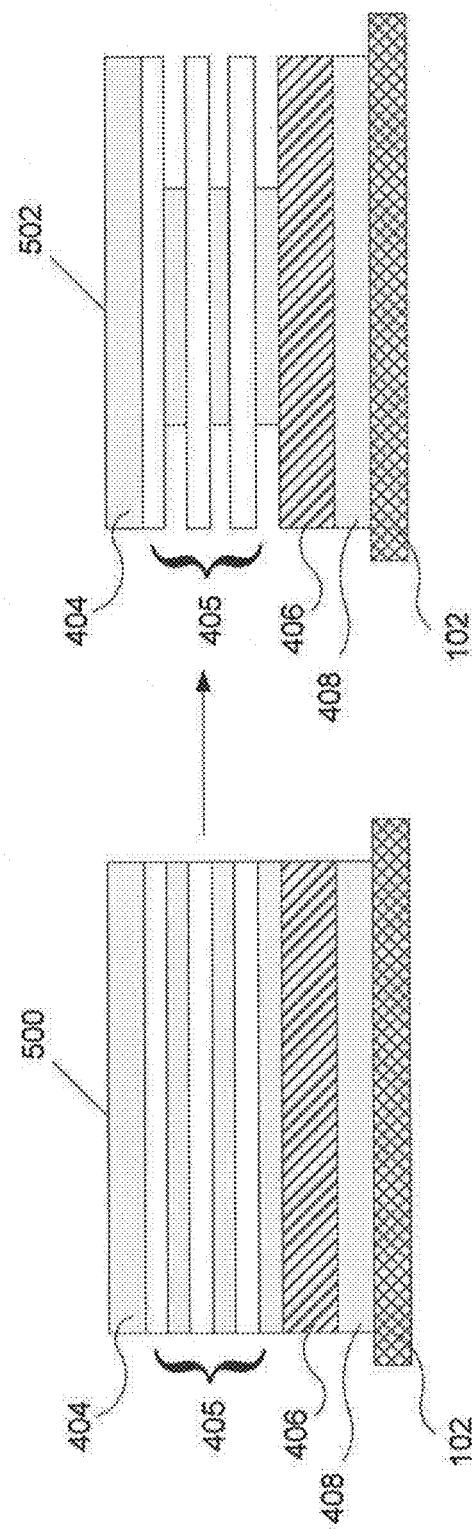
FIG. 21 is a schematic drawing of a structure, in cross-section, illustrating a method for removing a cell from a growth substrate consistent with the embodiments described herein.

In some embodiments, as exemplified in FIG. 21, structure 500 may comprise sacrificial layer 405, which represents a "super lattice" such as InAs/AlAs, wherein initial etching of sacrificial layer 405 results in the partial etching of the AlAs layers of the super lattice to yield the partially-etched sacrificial layer 405 of structure 502. Upon completion of the etch in intermediate structures 412 and 502, cell 204 is released to yield structure 414. In some embodiments, the removal of growth substrate 102 from intermediate structures 412 or 502 may be accomplished by using an etchant such as HF. Other suitable etchants may include phosphoric acid ($H_3PO_4$), hydrochloric acid (HCl), sulfuric acid ($H_2SO_4$), hydrogen peroxide ($H_2O_2$), nitric acid ($HNO_3$), citric acid ($C_6H_8O_7$), and combinations thereof. For example, suitable etchant combinations may include $H_3PO_4$:HCl, $H_2SO_4$:$H_2O_2$:$H_2O$, and HF:$H_2O_2$:$H_2O$.

Structure 414 comprises first protective layer 408, second protective layer 406, growth substrate 102, and optionally, at least one buffer layer. In the next step of FIG. 20, second protective layer 406 is removed by etching it with an etchant. Suitable etchants may include those discussed above. For example, a GaAs second protective layer may be removed with an $H_2SO_4:H_2O_2$ etchant. An InP second protective layer may be removed with, for example, an $H_3PO_4:HCl$ etchant. Removal of second protective layer 406 yields structure 416. In some embodiments, it may be desirable to etch first protective layer 408 from structure 416 to yield growth substrate 102. For example, an InGaP first protective layer may be etched away from a GaAs growth substrate using an $H_3PO_4:HCl$ etchant.

As discussed above, in some embodiments, structure 400 may further comprise at least one buffer layer positioned between sacrificial layer 405 and growth substrate 102. In some embodiments, the buffer layer may be positioned between growth substrate 102 and first protective layer 408. In some embodiments, the buffer layer is deposited directly on the growing surface of the growth substrate, and the first protective layer is disposed directly on the growing surface of the buffer layer. In circumstances where the first protective layer and growth substrate comprise the same material, it may be desirable to simply remove the at least one additional layer to yield a "buffered" growth structure. For example, an InGaAs additional layer may be etched from structure 416 to yield a buffered growth substrate comprising an InP buffer layer and an InP growth substrate.

Liberation of the growth substrate/buffered growth substrate may result in a very smooth surface that allows for the subsequent reuse of the wafer. In some embodiments, the buffer layer, after removing first protective layer 408, is smoother than the growing surface of growth substrate 102 prior to depositing the first protective layer during the preparation of structure 400. In some embodiments, the growing surface of the growth substrate, prior to depositing the first protective layer, exhibits an RMS (Roughness Measurement System) value of about 0.25 nm to about 0.35 nm, such as about 0.32 nm. In some embodiments, the growing surface of the buffer layer, after removing the first protective layer, exhibits an RMS value of about 0.10 nm to about 0.20 nm, such as about 0.16 nm. In some embodiments, the buffered growth substrate may be reused many times without the need for abrasive polishing.

However, in some embodiments, it may be desirable to further subject the buffered growth substrate to sonication. Sonication may be implemented to eliminate any residual surface features and/or defects. For example, in some embodiments it may be desirable to remove from a buffered InP growth substrate any residual InGaAs remaining from etching. In some embodiments, sonication may be undertaken with an appropriate acid solution, such as citric acid:$H_2O_2$.

Figure 28:
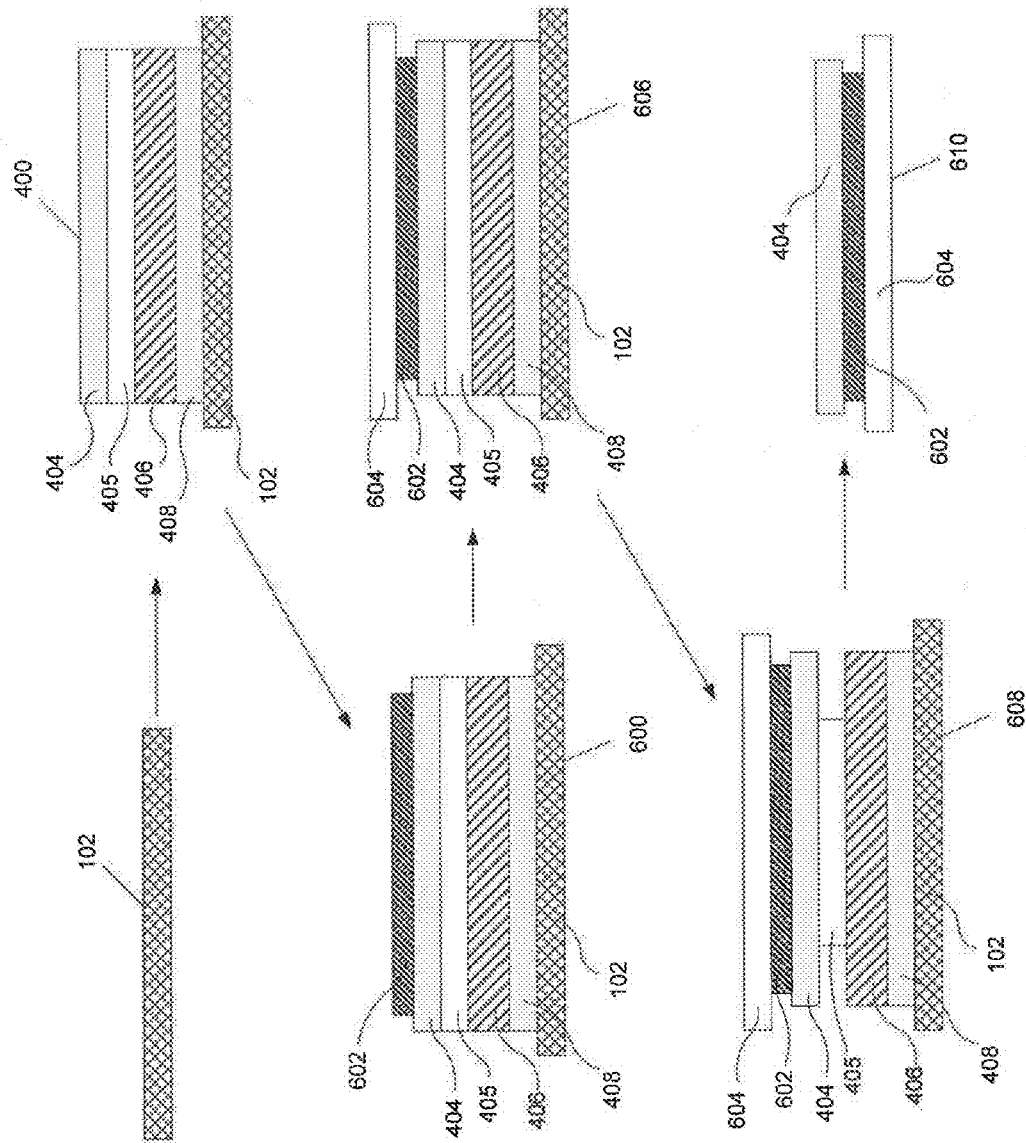
FIG. 28 is a schematic drawing of a structure, in cross-section, illustrating a method for preparing a PV device, consistent with the embodiments described herein.

FIG. 28 illustrates a schematic for the preparation of certain PV devices, such as flexible PV cells. The method of FIG. 28, which may be referred to as the "single flip" method, can be initiated through the selection of growth substrate 102. In the first step, first protective layer 408, second protective layer 406, sacrificial layer 405, and epilayer 404 may be sequentially deposited to yield structure 400. Suitable growth methods may include, for example, gas source molecular beam epitaxy, MOCVD (metallo-organic Chemical vapor deposition)/MOVPE (metalo-organic vapor phase Epitaxy), HVPE (hydride vapor phase Epitaxy), solid source MBE, and Chemical beam epitaxy. In some embodiments, epilayer 404 may comprise any active material that may be desirable for use in PV devices. Depending on the nature of the material, the PV active layers may exhibit different characteristics and/or levels of performance. Table 1 (above) compares the efficiencies and outputs of PV cells comprising different active layers.

In some embodiments, cell (epilayer) 404 may be selected from at least one of the materials described above for epilayer 106.

It should be understood that the certain release layers (e.g., etch stop layers) and/or release materials may be incorporated into epilayer 404 without making an express reference to a separate etch stop layer. For example, a device having a "GaAs/AlGaAs" structure may be referenced as single GaAs/AlGaAs epilayer stack. Alternatively, such a structure may be described as having more than one layer (e.g., a GaAs epilayer and an AlGaAs etch stop layer). Similarly, an "InGaAs/InP/InGaAs" structure may be described as an InGaAs/InP/InGaAs epilayer stack, or an InGaAs/InP epilayer stack and an InGaAs etch stop layer.

In the next step of the method illustrated in FIG. 28, structure 600 is prepared by depositing a contact layer on the surface of epilayer 404. Suitable contact layers, and the preparation thereof, include those described above with respect to FIG. 1.

Upon deposition of contact layer 602 to epilayer 404, epilayer 404 is bonded to host substrate 604 to form intermediate structure 606. In some embodiments, host substrate 604 may be coated with a material, such as a metal or alloy, similar to that selected for the contact layer deposited on epilayer 404. Such a coating may be effective in aiding the bonding of epilayer 404 to host substrate 604. For example, the contact layer of epilayer 404 may comprise Au, Ag, Pt, or Pd, while host substrate 604 is coated with the same metal. In some embodiments, suitable bonding techniques may include those described above with respect to the bonding of epilayer 106 and host substrate 110. However, in certain circumstances, it may be appropriate to bond host substrate 604 to epilayer 404 after liberation of growth substrate.

In an effort to create a flexible PV product, it may be desirable to transfer epilayer 404 to a thin and/or flexible host substrate. Therefore, in some embodiments, host substrate 604 may comprise at least one polymer. In some embodiments, the polymer may be selected from polyesters and polyimides. In some embodiments, suitable polyesters may include polyethylene terephthalate. Non-limiting examples of commercial polyesters that may be used include Mylar®. Non-limiting examples of commercial polyimides that maybe used include Kapton®.

Once intermediate structure 606 has been formed, epilayer 404 may be removed from growth substrate 102. In some embodiments, the removal of growth substrate 102 from intermediate structure 606 may be accomplished by the selective etching of sacrificial layer 404 using an etchant such as HF. Other suitable etchants have been previously discussed herein. Partial etching of sacrificial layer 404 will yield intermediate structure 608, followed by complete lateral etching.

The removal of growth substrate 102, along with its protective layers, will yield device 610. A top contact may be patterned on the exposed surface of epilayer 404 of device 610. Suitable top contacts may include those described above with respect to device 112.

If materials such as polyesters (e.g., Mylar®) and polyimides (e.g., Kapton®) are selected for host substrate 604, such as those described above with respect to host substrate 110, resulting device 610 may represent a light, flexible PV cell that is suitable for simplified methods of storage, transport, and deployment. The use of such materials can also reduce the weight of the resulting cells and create PV devices with large Watt/gram ratios, which may be useful for space applications and other weight-restricted technologies such as unmanned aerial vehicles (UAVs).

In some embodiments, the remaining growth substrate may be prepared for reuse by selectively etching away second protective layer 406 and first protective layer 408. In some embodiments, structure 400 may further comprise a buffer layer disposed between growth substrate 102 and first protective layer 408. Preparation of the growth substrate for reuse may be accomplished in a manner consistent with the embodiments described herein.

The invention will be further clarified by the following non-limiting examples, which are intended to be purely exemplary of the invention.

EXAMPLES

Figures 4A, 4B:
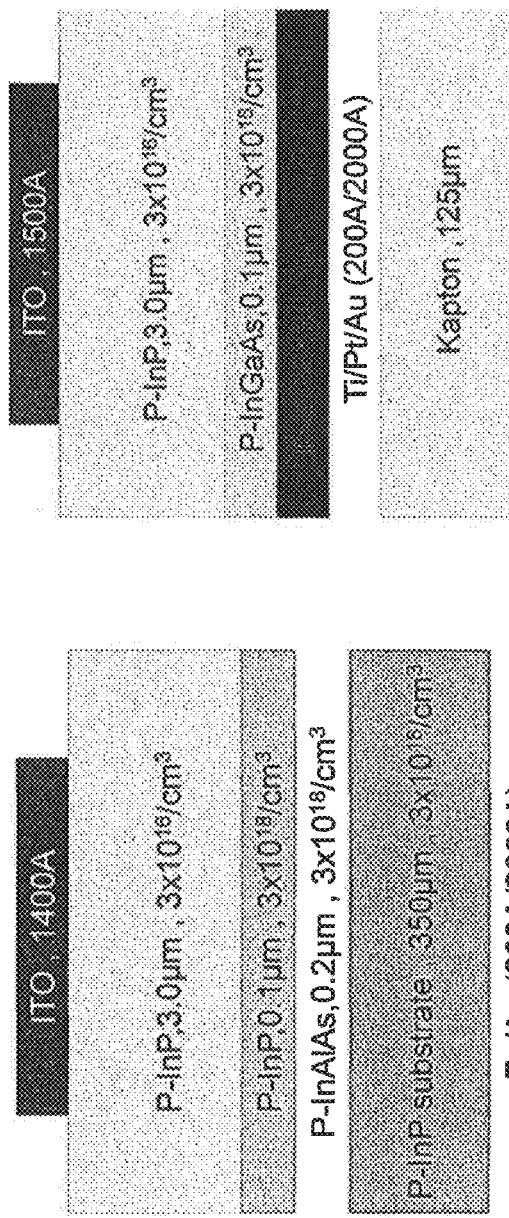
FIG. 4A is a schematic drawing of an exemplary control device, in cross section.
FIG. 4B is a schematic drawing of a flexible PV device, in cross-section, prepared in a manner consistent with the methods described herein.

FIG. 4A depicts the structure of an exemplary control device having a InP/InP stack epilayer and an InP growth substrate. The device also has an InAlAs etch layer, with an ITO top contact and Zn/Au contact layer. FIG. 4B represents a device prepared by the method outlined in FIG. 1. The device in FIG. 4B represents a device having a InP/InGaAs/InGaAs stack for the epilayer and a Kapton® host substrate. The device also has an ITO top contact and a Ti/Pt/Au stack for the contact layer.

Figure 5A:
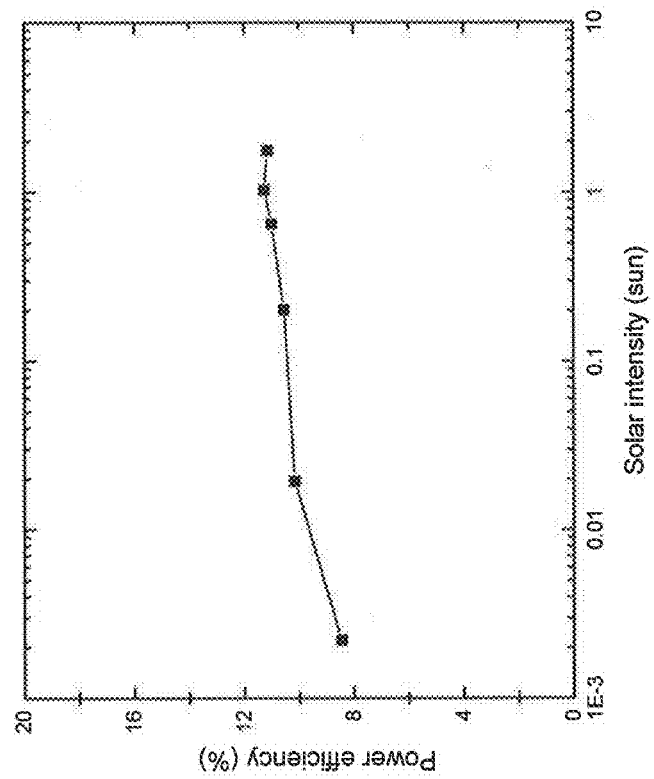
FIG. 5A represents the power efficiency (%) versus light intensity (sun) for the control device of FIG. 4A.
Figure 5B:
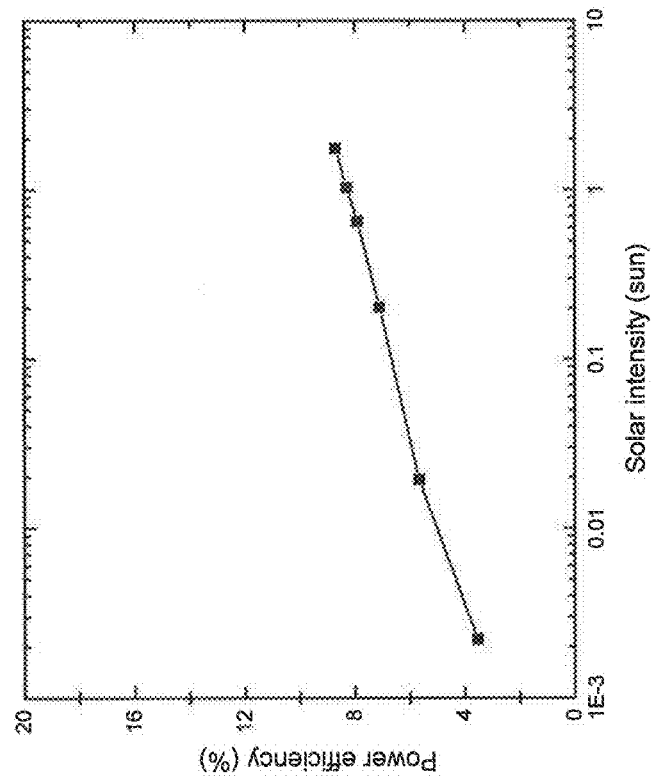
FIG. 5B represents the power efficiency (%) versus light intensity (sun for the flexible PV device of FIG. 4B.

FIG. 5A represents the power efficiency (%) versus light intensity (sun) for the control device in FIG. 4A, as compared to the results for the device of FIG. 4B, which are shown in FIG. 5B. FIG. 6A represents the open voltage circuit (VOC) versus light intensity (sun) for the control device in FIG. 4A, as compared to the results for the device of FIG. 4B, which are shown in FIG. 6B. FIG. 7A represents the fill factor (%) versus light intensity (sun) for the control device in FIG. 4A, as compared to the results for the device of FIG. 4B, which are shown in FIG. 7B.

Figure 8A:
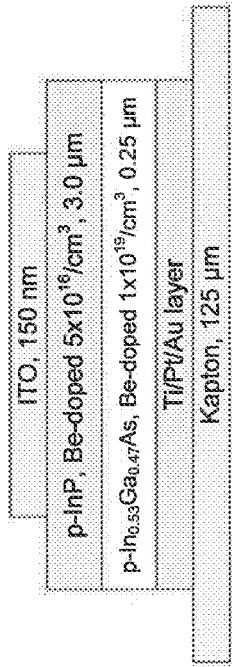
FIG. 8A is a schematic drawing of an exemplary control wafer, in cross section.

FIG. 8A depicts the structure of an exemplary control wafer having a InGaAs/InP stack epilayer and an InGaAs etch stop layer, each of which is doped with Be. The wafer also has an InP substrate doped with Zn. The wafer was prepared by growth on the InP substrate by gas source molecular beam epitaxy. The base layer of the epilayer stack is a p-doped InP layer that is 3.0 μm thick. The top side of the epilayer comprises a heavily Be-doped lattice-matched InGaAs layer that provides the location for the p-type ohmic contact of the resulting flexible PV device.

Figure 8B:
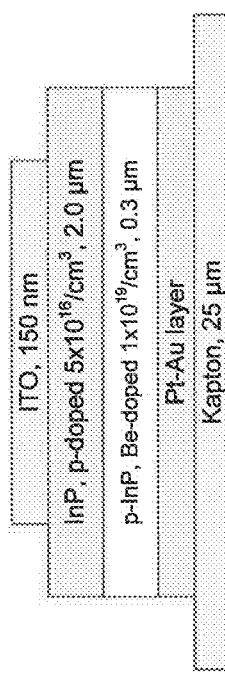
FIG. 8B is a schematic drawing of a flexible PV device, in cross-section, prepared in a manner consistent with the methods described herein.

The exemplary flexible PV device of FIG. 8B was prepared through the "single flip" method, starting with the e-beam deposition of a p-metal (Ti/Pt/Au) on both the topside (InGaAs) of the epilayer of the wafer depicted in FIG. 8A, and a 125 μm thick Kapton® sheet. After annealing of the FIG. 8A wafer at 350° C. for 90 seconds, the top InGaAs layer was flipped down and the wafer was mounted on the coated Kapton® sheet via silver paste. The InP substrate and the InGaAs etch stop layer were then removed using a solution of phosphoric acid/hydrochloric acid ($H_3PO_4$: HCl=1:3), and sulfuric acid/hydrogen peroxide ($H_2SO_4$: $H_2O_2$: $H_2O$=1:1:10), respectively. An ITO contact layer 150 nm thick and area of about 0.00785 $cm^2$ was then sputtered through a shadow mask, yielding the resulting flexible PV device of FIG. 8B.

Figure 8C:
FIG. 8C is a schematic drawing of an exemplary control wafer, in cross section.

FIG. 8C depicts an exemplary control wafer grown by gas source molecular beam epitaxy on a p-type Zn-doped (100) InP substrate. The structure consists of a 0.375 μm thick, p-type ($5\times10^{16}$ $cm^{-3}$) InP buffer layer, a 0.25 μm thick, lattice-matched Be-doped ($5\times10^{16}$ $cm^{-3}$) p-type $In_{0.53}Ga_{0.47}As$ etch-stop layer, a 2.0 μm thick, lightly p-doped ($5\times10^{16}$ $cm^{-3}$) InP absorption layer, and finally, a 0.3 μm thick, lattice-matched Be-doped ($1\times10^{19}$ $cm^{-3}$) p-type InP ohmic contact layer.

Figure 8D:
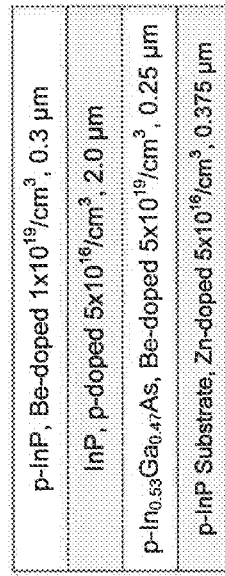
FIG. 8D is a schematic drawing of a flexible PV device, in cross-section, prepared in a manner consistent with the methods described herein.

The exemplary flexible PV device of FIG. 8D was prepared through the "single flip" method, starting with the e-beam deposition of a p-metal contact (Pt—Au) on both (each with thicknesses of 300 Å) the top InP contact of the epilayer of the wafer depicted in FIG. 8C, and a 25 μm thick Kapton® sheet. After e-beam evaporation, the wafer is mounted p-contact side down on the Pt/Au-coated Kapton® sheet by cold-welding, using an MTS Alliance RT/100 Testing System, which applying a pressure of 500 MPa for 60 secs. The InP substrate and the subsequent $In_{0.53}Ga_{0.47}As$ etch stop layer are then removed using a $H_3PO_4$: HCl=1:3 solution, followed by $H_2SO_4$: $H_2O_2$: $H_2O$=1:1:10. The etch rates for these solutions are about 3 μm/min for InP and about 0.2 μm/min for $In_{0.53}Ga_{0.47}As$, respectively. Finally, a 150 nm thick indium-tin-oxide (ITO) Schottky diode contact with the area of 0.785 $mm^2$ defined by a shadow mask is sputtered at a base pressure of $2\times10^{-6}$ torr, RF power of 40 W, and deposition rate of 0.2 Å/sec, yielding the resulting flexible PV device of FIG. 8D.

Figure 9A:
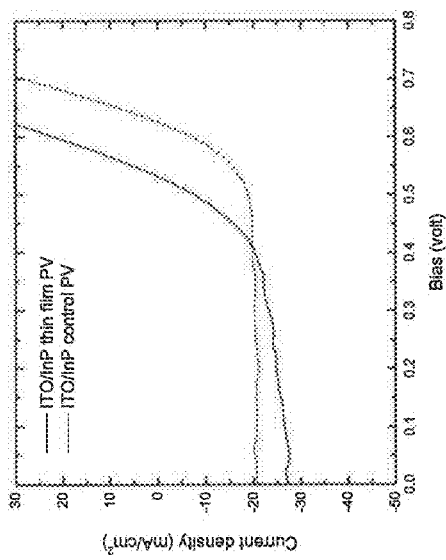
FIG. 9A represents the current density/voltage characteristics of both the control wafer of FIG. 8A (ITO/InP control PV) and the flexible PV device of FIG. 8B (ITO/InP thin film PV) taken under room temperature, AM1.5G simulated solar spectrum at 1 sun intensity (100 mW/cm$^2$).
Figure 9B:
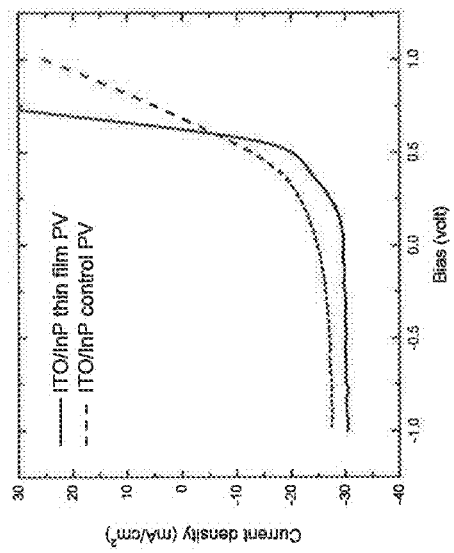
FIG. 9B represents the current density/voltage characteristics of both the control wafer of FIG. 8C (ITO/InP control PV) and the flexible PV device of FIG. 8D (ITO/InP thin film PV) taken under room temperature, AM1.5G simulated solar spectrum at 1 sun intensity (100 mW/cm$^2$)
Figure 10B:
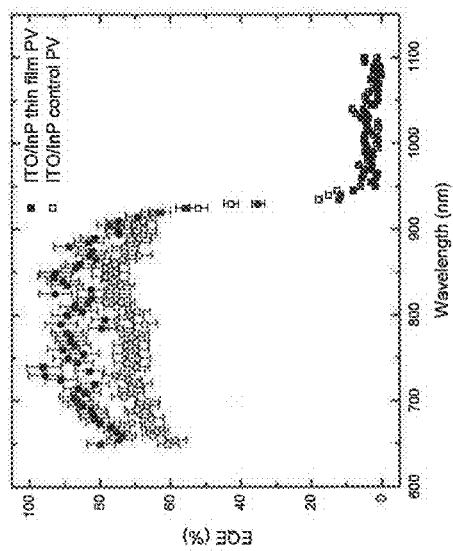
FIG. 10B represents the EQE characteristics of both the FIG. 8C wafer (ITO/InP control PV) and the FIG. 8D flexible PV device (ITO/InP thin film PV) over the entire AM 1.5 solar spectrum.
Figure 10A:
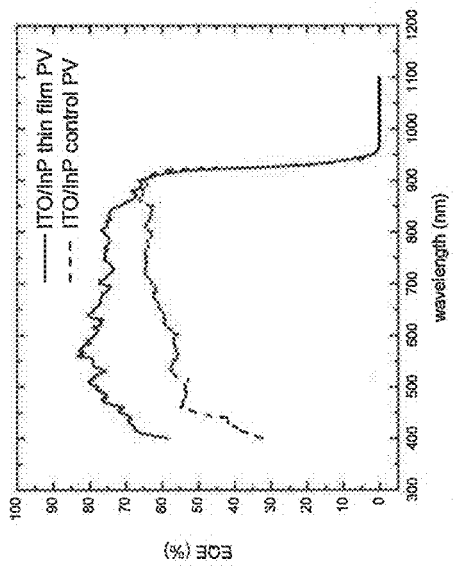
FIG. 10A represents the EQE characteristics of both the control wafer of FIG. 8A (ITO/InP control PV) and the flexible PV device of FIG. 8B (ITO/InP thin film PV) between wavelength of 650 nm and 1100 nm.
Figure 11B:
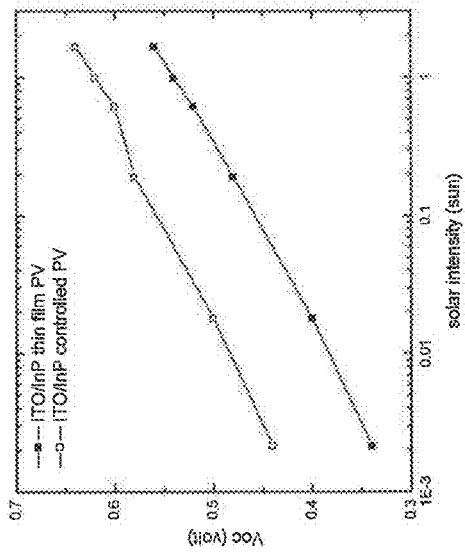
FIG. 11B represents the VOC of both the control wafer of FIG. 8A (ITO/InP control PV) and the flexible PV device of FIG. 8B (ITO/InP thin film PV) under various solar intensities.
Figure 11D:
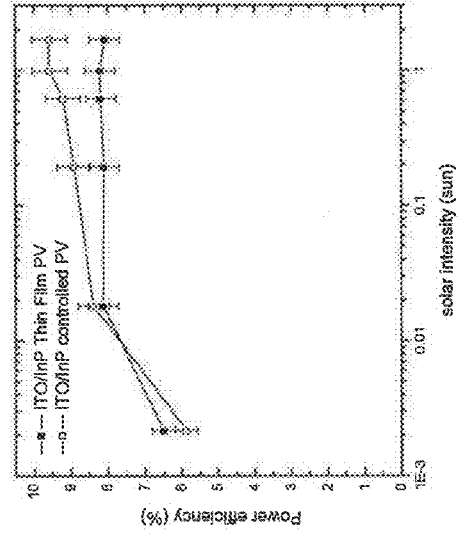
FIG. 11D represents the power efficiency of both the control wafer of FIG. 8A (ITO/InP control PV) and the flexible PV device of FIG. 8B (ITO/InP thin film PV) under various solar intensities.
Figure 11A:
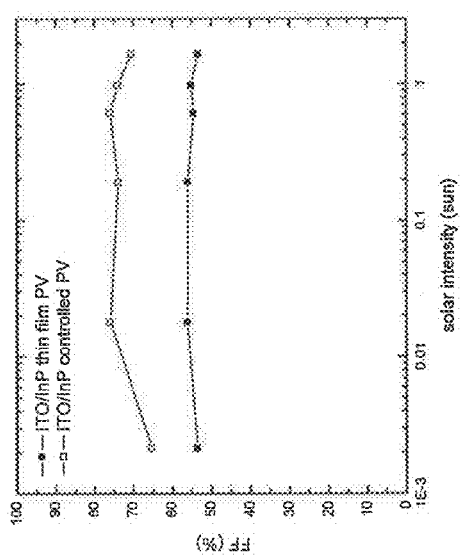
FIG. 11A represents the fill factor of both the control wafer of FIG. 8A (ITO/InP control PV) and the flexible PV device of FIG. 8B (ITO/InP thin film PV) under various solar intensities.
Figure 11C:
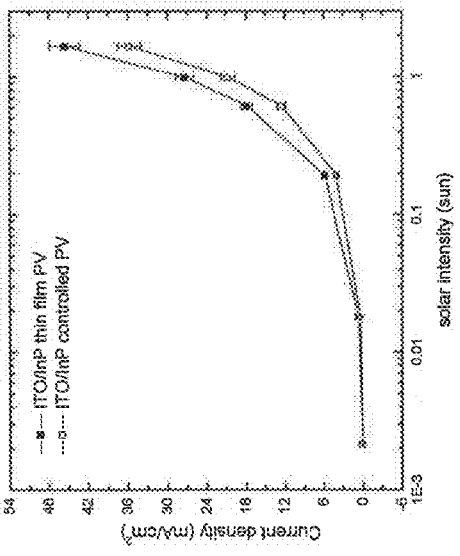
FIG. 11C represents the current density of both the control wafer of FIG. 8A (ITO/InP control PV) and the flexible PV device of FIG. 8B (ITO/InP thin film PV) under various solar intensities.
Figure 11F:
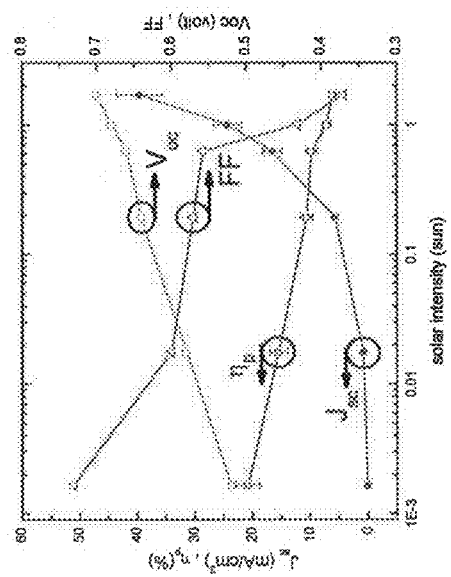
FIG. 11F show the fill factor, VOC, current density, and power efficiency of the FIG. 8C control wafer.
Figure 11E:
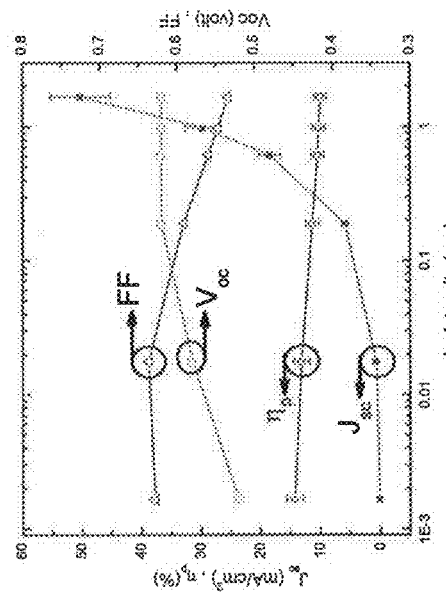
FIG. 11E show the fill factor, VOC, current density, and power efficiency of the FIG. 8D flexible PV device.

FIG. 9A represents the current density/voltage characteristics of both the FIG. 8A wafer (ITO/InP control PV) and the FIG. 8B flexible PV device (ITO/InP thin film PV) taken under room temperature, AM1.5G simulated solar spectrum at 1 sun intensity (100 mW/$cm^2$). FIG. 9B represents the current density/voltage characteristics of both the FIG. 8C wafer (ITO/InP control PV) and the FIG. 8D flexible PV device (ITO/InP thin film PV) taken under room temperature, AM1.5G simulated solar spectrum at 1 sun intensity (100 mW/$cm^2$). FIG. 10A represents the EQE characteristics of both the FIG. 8A wafer (ITO/InP control PV) and the FIG. 8B flexible PV device (ITO/InP thin film PV) between wavelength of 650 nm and 1100 nm. FIG. 10B represents the EQE characteristics of both the FIG. 8C wafer (ITO/InP control PV) and the FIG. 8D flexible PV device (ITO/InP thin film PV) over the entire AM 1.5 solar spectrum. FIGS. 11A-D exhibit the fill factor, VOC, current density, and power efficiency of both the FIG. 8A wafer (ITO/InP control PV) and the FIG. 8B flexible PV device (ITO/InP thin film PV) under various solar intensities. FIGS. 11E and 11F show the fill factor, VOC, current density, and power efficiency of the FIG. 8D flexible PV device and the FIG. 8C control wafer, respectively.

Figure 12A:
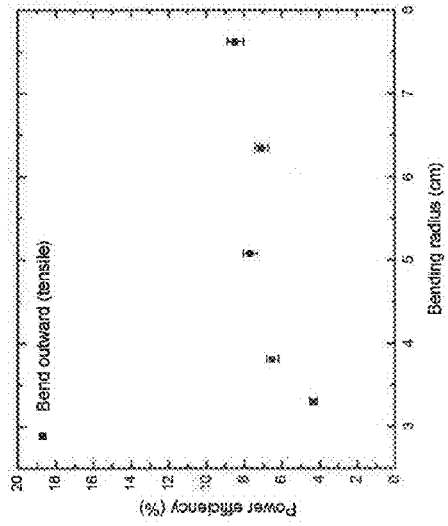
FIG. 12A represents the power efficiency vs. bend radius of the flexible PV device of FIG. 8B under compressive stresses.
Figure 12B:
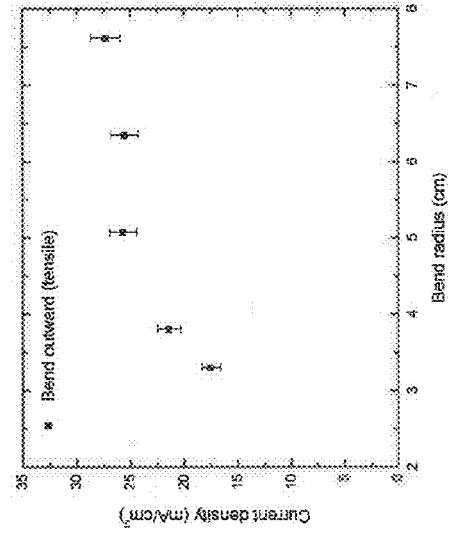
FIG. 12B represents the power efficiency vs. bend radius of the flexible PV device of FIG. 8B under tensile stresses.
Figure 12C:
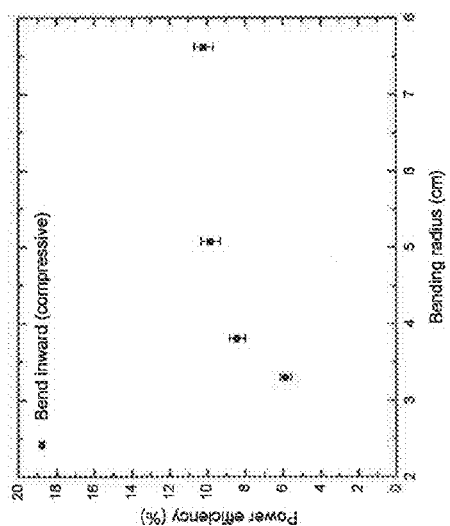
FIG. 12C represents the current density vs. bend radius of the flexible PV device of FIG. 8B under compressive stresses.
Figure 12D:
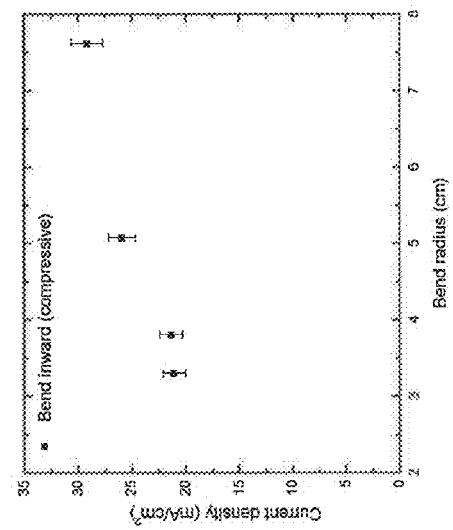
FIG. 12D represents the current density vs. bend radius of the flexible PV device of FIG. 8B under tensile stresses.
Figure 13B:
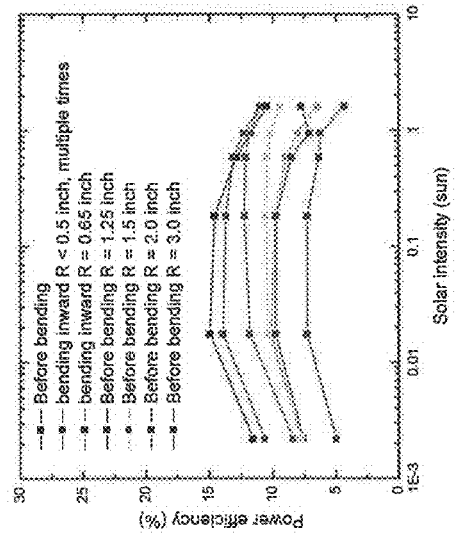
FIG. 13B represents the power efficiency vs. solar intensity of the FIG. 8B flexible PV device under compressive stresses.
Figure 13A:
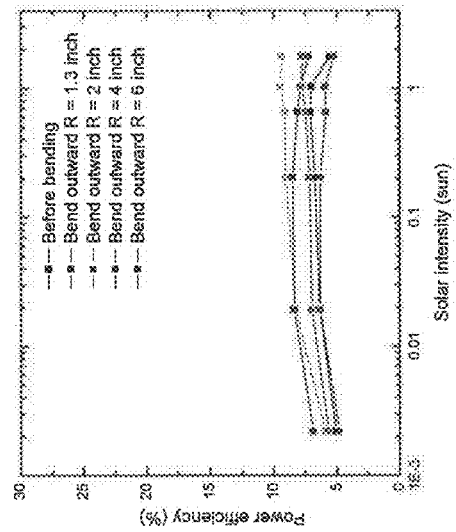
FIG. 13A represents the power efficiency vs. solar intensity of the FIG. 8B flexible PV device under tensile stresses.
Figure 14B:
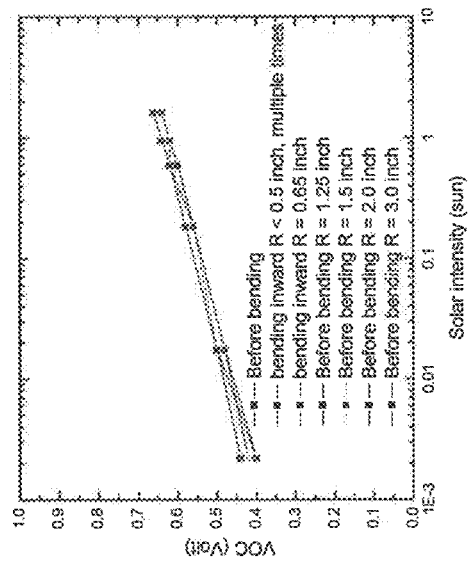
FIG. 14B represents the VOC vs. solar intensity of the FIG. 8B flexible PV device under compressive stresses.
Figure 14A:
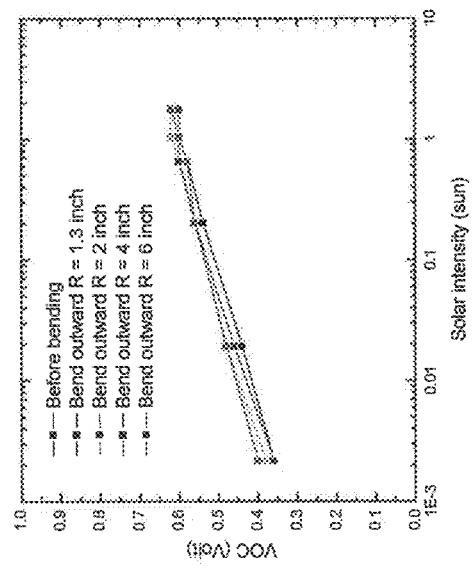
FIG. 14A represents the VOC vs. solar intensity of the FIG. 8B flexible PV device under tensile stresses.
Figure 15B:
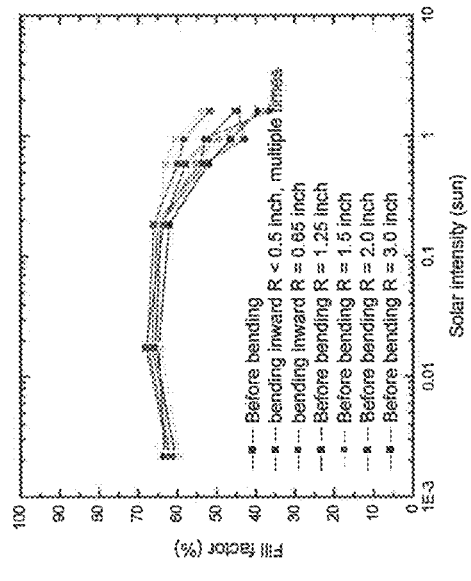
FIG. 15B represents the fill factor vs. solar intensity of the FIG. 8B flexible PV device under compressive stresses.
Figure 15A:
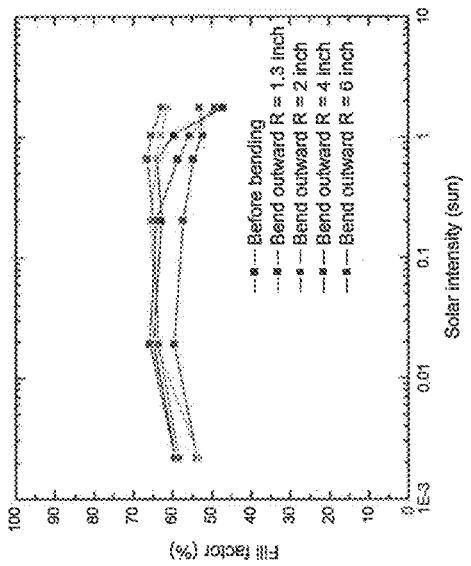
FIG. 15A represents the fill factor vs. solar intensity of the FIG. 8B flexible PV device under tensile stress.
Figure 16B:
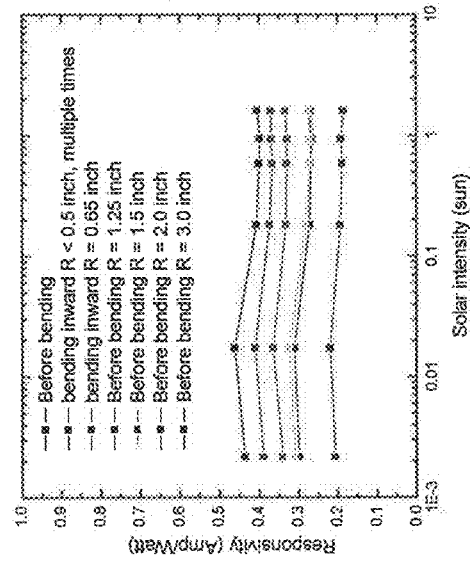
FIG. 16B represents the responsivity vs. solar intensity of the FIG. 8B flexible PV device under compressive stresses.
Figure 16A:
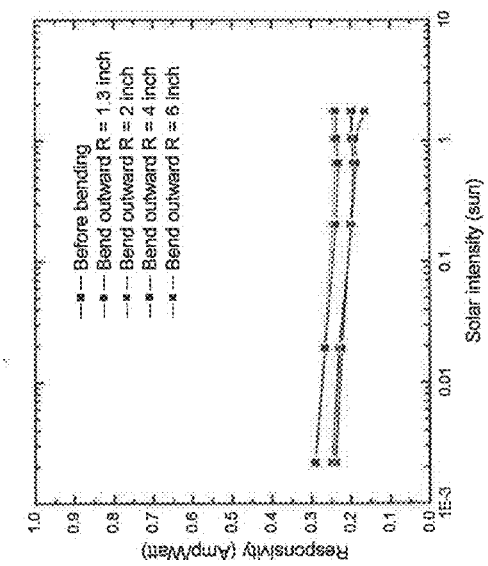
FIG. 16A represents the responsivity vs. solar intensity of the FIG. 8B flexible PV device under tensile stresses.

FIGS. 12A and B depict the power efficiency vs. bend radius of the flexible PV device of FIG. 8B under compressive and tensile stresses. FIGS. 12C and D depict the current density vs. bend radius of the flexible PV device of FIG. 8B under compressive and tensile stresses. FIGS. 13A and B depict the power efficiency vs. solar intensity of the FIG. 8B flexible PV device under tensile and compressive stresses. FIGS. 14A and B depict the VOC vs. solar intensity of the FIG. 8B flexible PV device under tensile and compressive stresses. FIGS. 15A and B depict the fill factor vs. solar intensity of the FIG. 8B flexible PV device under tensile and compressive stresses. FIGS. 16A and B depict the responsivity vs. solar intensity of the FIG. 8B flexible PV device under tensile and compressive stresses.

Figure 17B:
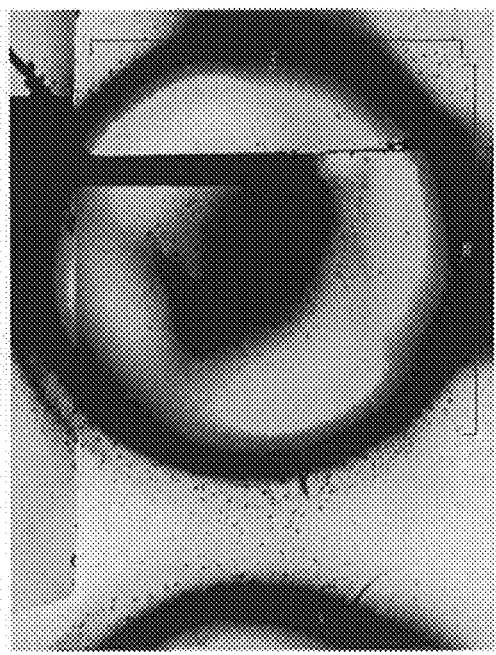
FIG. 17B is an image of the FIG. 8B flexible PV device after being subjected to all of the compressive stresses identified in FIGS. 13-16.
Figure 17A:
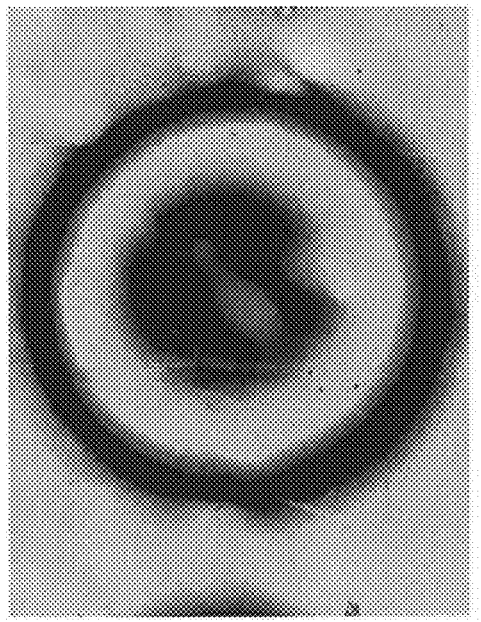
FIG. 17A is an image of the FIG. 8B flexible PV device after being subjected to all of the tensile stresses identified in FIGS. 13-16.

FIGS. 17A and B exhibit images of the FIG. 8B flexible PV device after being subjected to all of the stresses identified in FIGS. 13-16.

Figure 18:
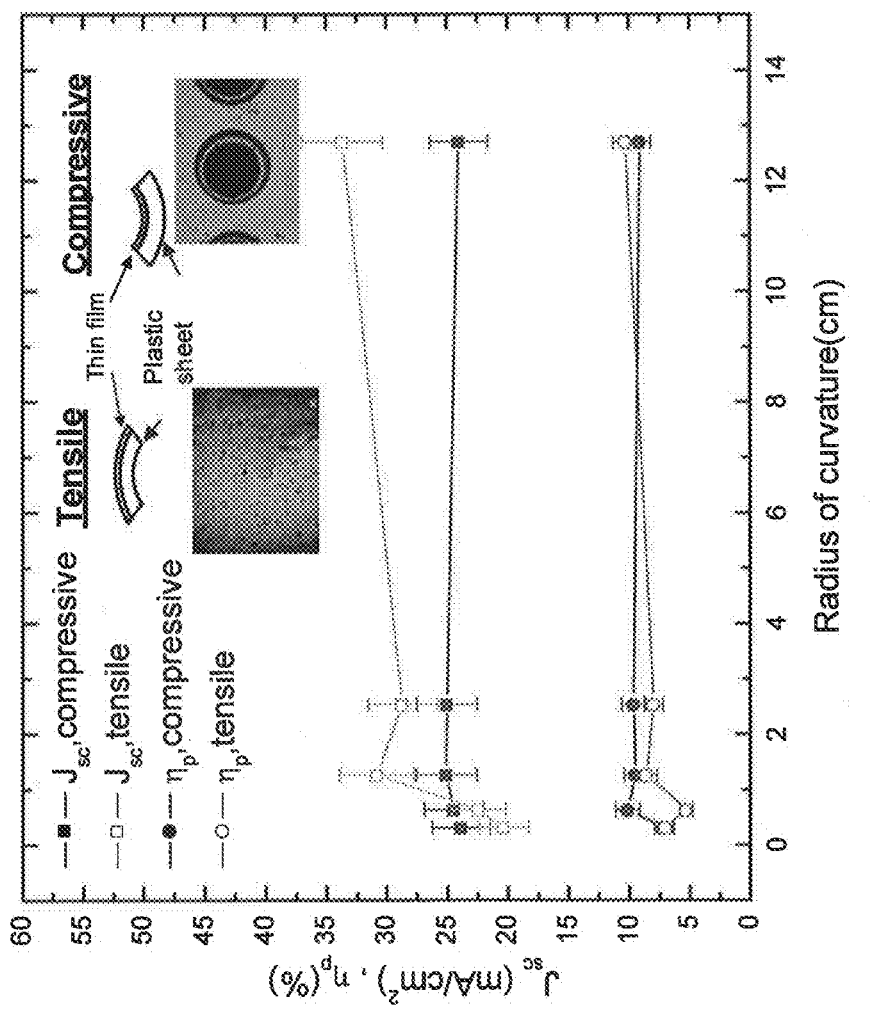
FIG. 18 exhibits the performance of a flexible PV device represented by FIG. 8D, after being subjected to tensile and compressive stresses.

FIG. 18 exhibits the performance of a flexible PV device represented by FIG. 8D, after being subjected to tensile and compressive stresses.

FIG. 19 compares the performance of a flexible PV device represented by FIG. 8D with different devices.

FIG. 20 exhibits an exemplary method for preserving the smoothness of a GaAs substrate after epitaxial liftoff using an AlAs sacrificial layer.

FIG. 21 exhibits an exemplary method for preserving the smoothness of a InP substrate after epitaxial liftoff using a super-lattice of InAs/AlAs as a sacrificial layer.

Figure 24:
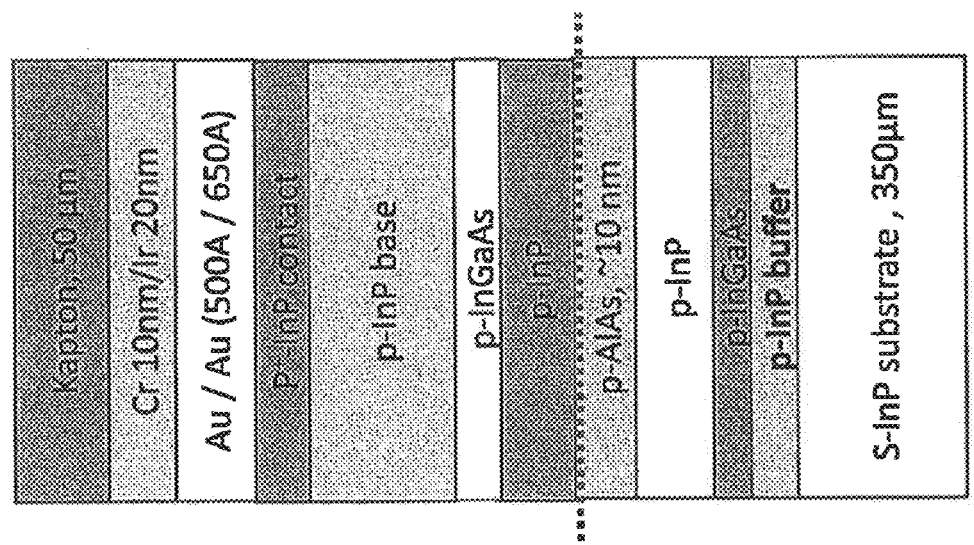
FIG. 24 exhibits an exemplary growth structure and layer sequence, in cross section, which is consistent with the embodiments described herein.

FIG. 24 exhibits an exemplary growth structure, in cross section, which was prepared in the following manner. The epitaxial layers were grown, starting with a 0.2 µm thick InP buffer layer, on a S-doped (100) InP substrate by gas source molecular beam epitaxy (GSMBE). Then, a 0.1 µm thick lattice-matched $In_{0.53}Ga_{0.47}As$ etch stop layer, followed by a 1.5 µm thick InP protection layer were grown. At this point, a 10 nm thick AlAs sacrificial layer is grown, which is later etched away to separate the active layers from the parent wafer. Next, a second 1.5 µm thick InP protection layer is grown, followed by a 0.1 µm thick lattice-matched $In_{0.53}Ga_{0.47}As$ etching stop layer, and then the active region consisting of a 3.0 µm thick lightly Be-doped ($3 \times 10^{16}$ cm$^{-3}$) InP base layer with 0.1 µm thick highly Be-doped ($3 \times 10^{18}$ cm$^{-3}$) InP Ohmic contact layer is grown. For the second growth, the InP buffer layer thickness was increased from 0.2 µm to 2 µm to smooth the surface. In all other respects, the first and second regrown epitaxial structures were substantially similar.

Immediately following growth, a 100 Å thick Cr adhesion layer followed by a 600 Å Au contact layer were sputtered onto a 50 µm thick Kapton® sheet, and a 600 Å of Au layer was deposited on the highly p-doped InP epitaxial layers by electron-beam evaporation.

After metal deposition, the wafer is mounted Au-side down on the plastic sheet and a cold-weld bond is formed by applying a pressure of 10 MPa for 60 s using an MTS Alliance RT/100 Testing system, and is consistent with the method described by Plossl et al., Mat. Sci. Eng. R. 25, 1 (1999), which is incorporated herein by reference in its entirety for all purposes. Then, the Kapton® sheet is affixed to a rotatable, 7.5 cm diameter Teflon rod with Kapton® tape, and immersed into an etching solution of $HF:H_2O$ (1:10). To expedite the ELO process, a 13 g weight is mounted on the plastic substrate, and the Teflon rod is rotated to maintain an external force on the wafer while increasing the gap between the epitaxial layers and substrate as the etching proceeds. This ensures that the epilayer/substrate interface will constantly be exposed to fresh etchant throughout the process.

After completing the ELO, the Au residue on the original InP substrate is removed by etching (etchant type TFA, Transene Co.). The InP protection and $In_{0.53}Ga_{0.47}As$ etch-stop layers on both the substrate and solar cell were then selectively removed by etching in $H_3PO_4:HCl$ (1:3) and $H_2SO_4: H_2O_2: H_2O$ (1:1:10), respectively. Subsequently, citric acid:$H_2O_2$ (20:1) was used to fully remove the remaining $In_{0.53}Ga_{0.47}As$. The newly exposed InP substrate surface was then degreased by sequential dipping in heated trichloroethylene, acetone, and heated iso-propanol, followed by the intentional growth of an oxide by exposure to UV/ozone for 10 min. The substrate was then loaded back into the GSMBE chamber and degassed. The second photovoltaic cell was then grown on the original parent substrate using the identical procedure described above, followed by a second round of cold welding and ELO.

To fabricate the ITO/InP Schottky junction, exposure to UV/ozone for 7 min removed the surface contaminants and forms a thin, passivating native-oxide. The ITO is sputter-deposited at a rate of 0.3 Å/s through a shadow mask with an array of 1 mm diameter openings. A control, thin-film ITO/InP solar cell cold-welded onto the Kapton® sheet with the same epitaxial structure was fabricated via complete substrate removal, as described previously by Shiu et al., Appl. Phys. Lett. 95, 223503 (2009), which is incorporated herein by reference in its entirety for all purposes. Solar cell characterization was carried out under simulated AM1.5G illumination.

Figure 25A:
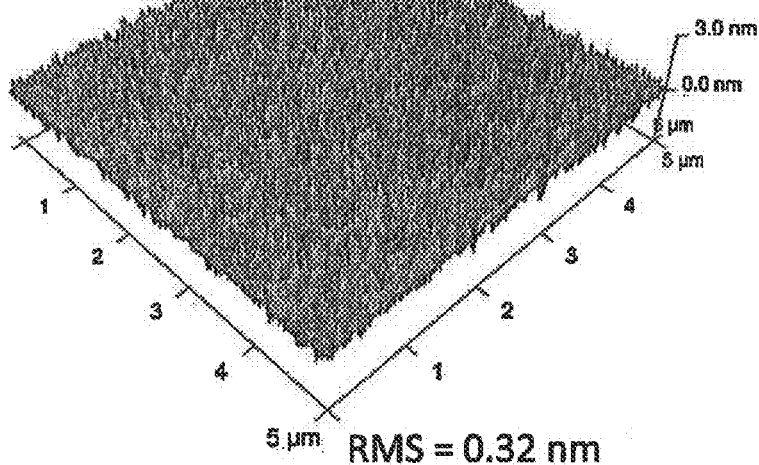
FIG. 25A is an atomic force micrograph of the surface of an InP wafer prior to preparation of the growth structure in FIG. 24.

FIG. 25A is an atomic force micrograph of the surface of an InP wafer prior to preparation of the growth structure in FIG. 24.

Figure 25B:
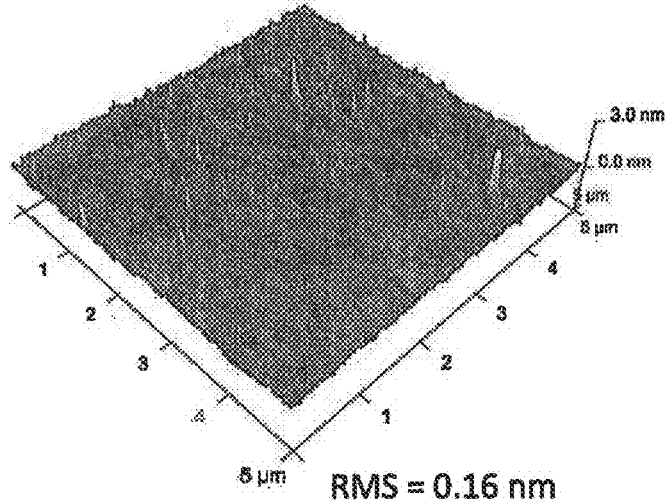
FIG. 25B is an atomic force micrograph of the surface of an InP wafer after epitaxial liftoff (ELO) and etching of the structure in FIG. 24, in a manner consistent with the embodiments described herein.

FIG. 25B is an atomic force micrograph of the surface of an InP wafer after epitaxial liftoff (ELO) and etching of the structure of FIG. 24, as described above.

Figure 26A:
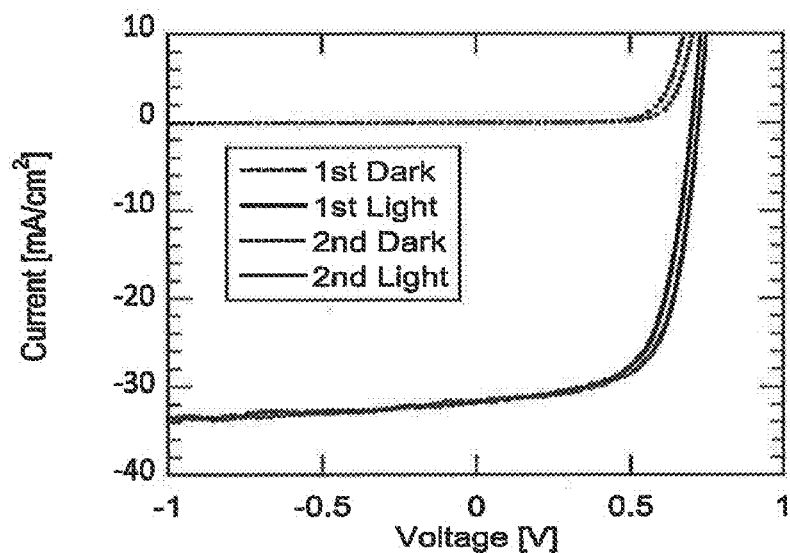
FIG. 26A represents IV plots of a first device grown on a new InP wafer, and a second device grown on a reused InP wafer prepared in a manner consistent with the embodiments described herein.

FIG. 26A represents IV plots of a first device grown on a new InP wafer, and a second device grown on a reused InP wafer prepared in a manner consistent with the embodiments described herein.

Figure 26B:
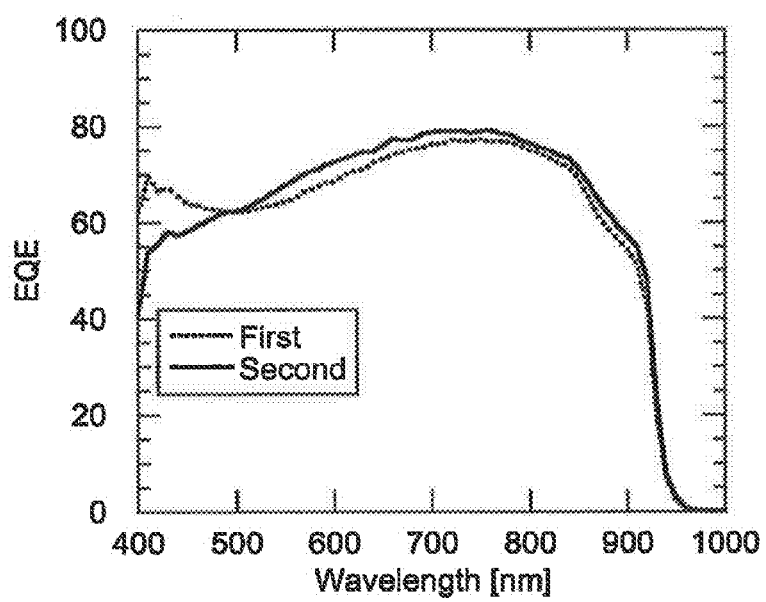
FIG. 26B represents electric quantum efficiency (EQE) plots corresponding to the devices in FIG. 26A.

FIG. 26B represents electric quantum efficiency (EQE) plots corresponding to the devices in FIG. 26A.

Figure 27A:
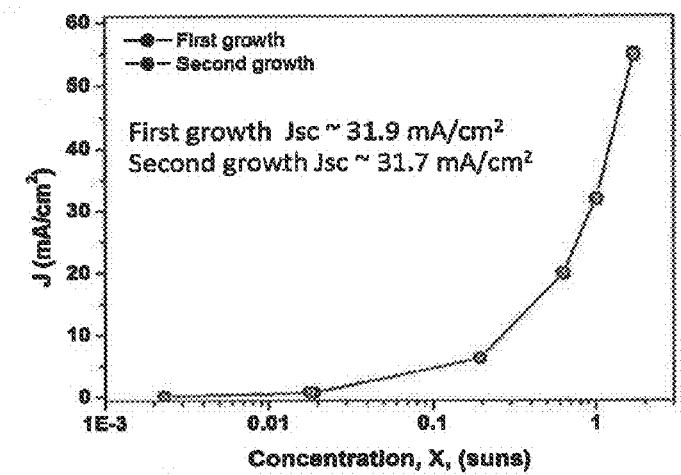
FIG. 27A represents the short circuit current (ISC) corresponding to the devices in FIG. 26A.

FIG. 27A represents the short circuit current (ISC) corresponding to the devices in FIG. 26A.

Figure 27B:
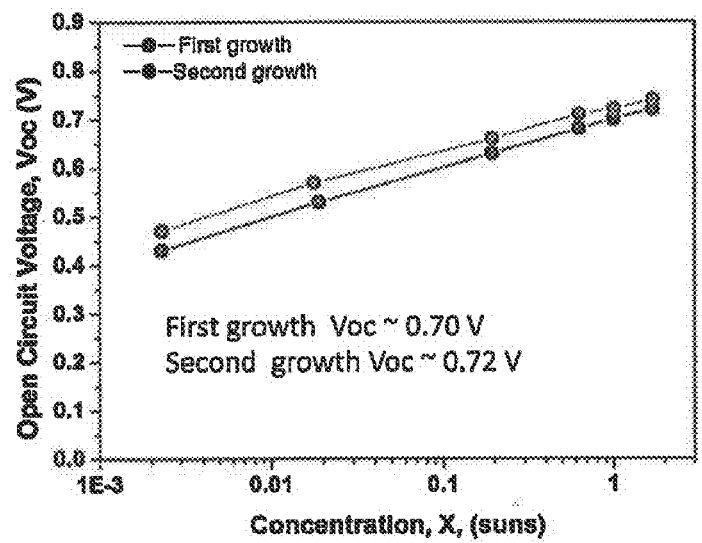
FIG. 27B represents the open circuit voltage (VOC) corresponding to the devices in FIG. 26A.

FIG. 27B represents the open circuit voltage (VOC) corresponding to the devices in FIG. 26A.

Figure 27C:
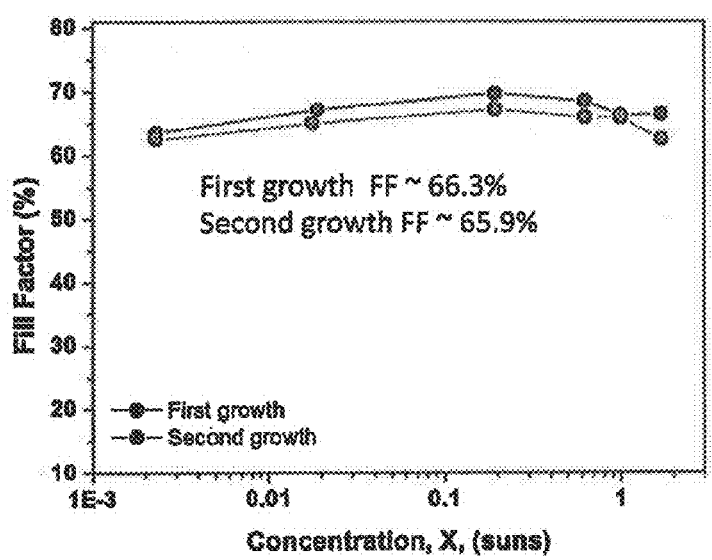
FIG. 27C represents the fill factor (FF) corresponding to the devices in FIG. 26A.

FIG. 27C represents the fill factor (FF) corresponding to the devices in FIG. 26A.

Figure 27D:
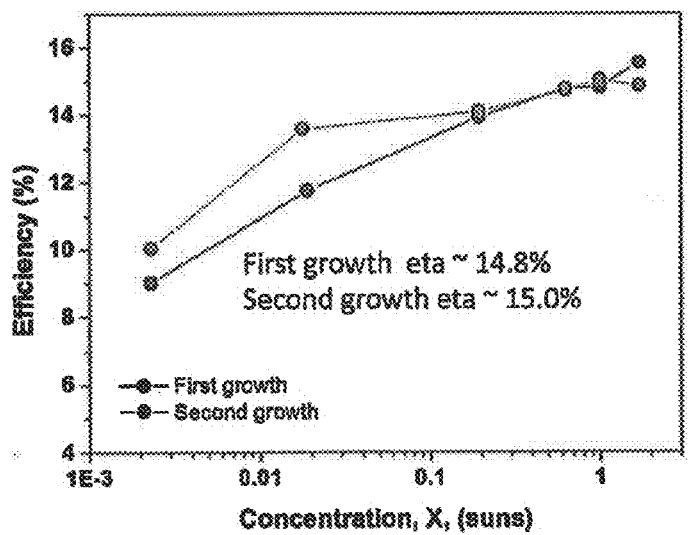
FIG. 27D represents the power conversion efficiency corresponding to the devices in FIG. 26A.

FIG. 27D represents the power conversion efficiency corresponding to the devices in FIG. 26A.

Figure 29A:
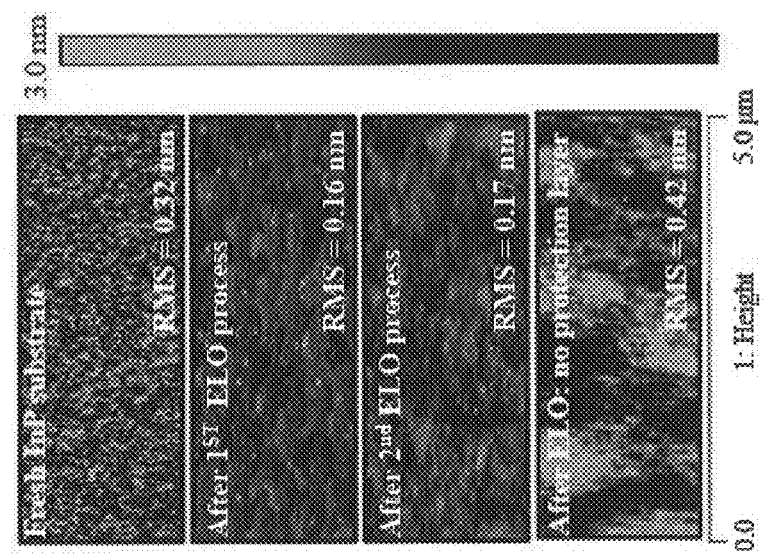
FIG. 29A represents an atomic force micrograph reporting RMS values for a fresh InP substrate, followed by the RMS values after ELO liftoff of the first and second devices described in FIG. 26A, and the RMS value of a device after ELO without the use of a protective buffer layer.
Figure 29:
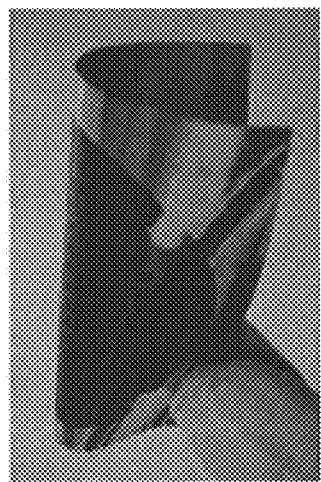
FIG. 29B is an image of lifted-off 2-inch-diameter epitaxial layer containing an array of ITO/InP thin film solar cells fabricated by a combination of ELO and cold-weld bonding as a 50 µm thick Kapton® sheet.

FIG. 29A represents an atomic force micrograph reporting RMS values for a fresh InP substrate, followed by the RMS values after ELO liftoff of the first and second devices described in FIG. 26A, and the RMS value of a device after ELO without the use of a protective buffer layer.

FIG. 29B is an image of lifted-off 2-inch-diameter epitaxial layer containing an array of ITO/InP thin film solar cells fabricated by a combination of ELO and cold-weld bonding to a 50 µm thick Kapton® sheet.

Figure 30:
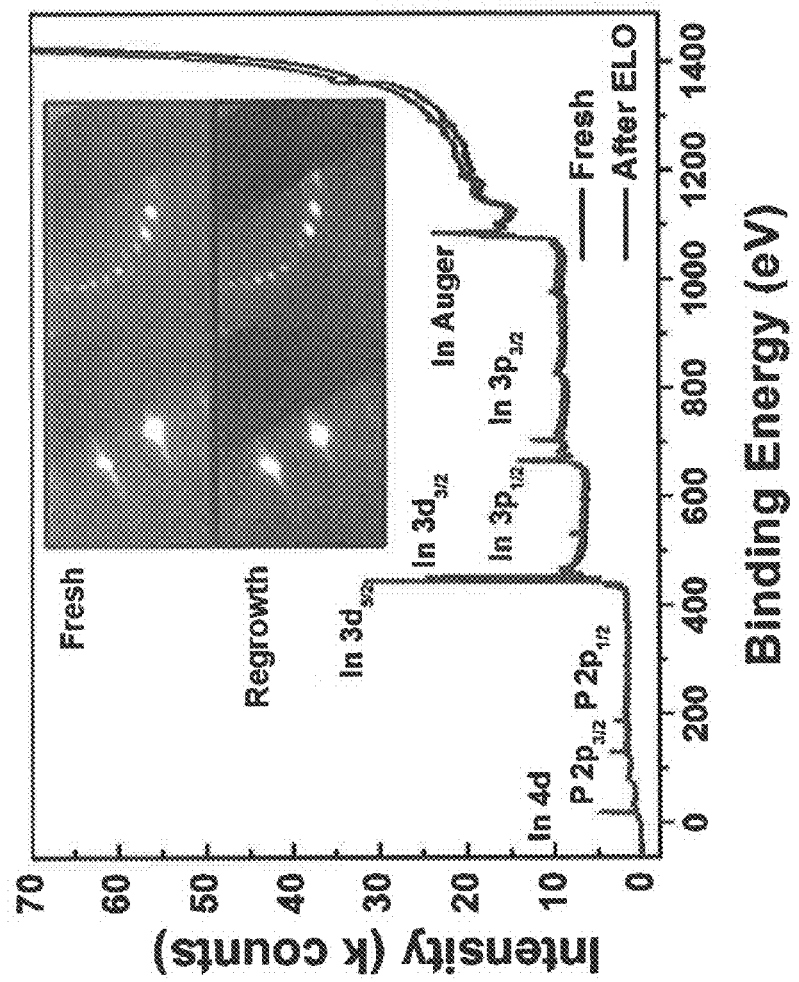
FIG. 30 represents the X-ray photoelectron spectroscopy intensity (kcounts) versus binding energy (eV) of a fresh InP wafer prior to preparation of the growth structure in FIG. 24 compared to the InP wafer following preparation and ELO.

FIG. 30 represents the intensity (k counts) versus binding energy (eV) of a fresh InP wafer prior to preparation of the growth structure in FIG. 24 compared to the InP wafer following preparation and ELO.

FIG. 31 represents the current density versus voltage characteristics of the first and the second ELO processed ITO/InP and the control solar cells bonded to a Kapton® sheet, and measured under 1 sun, AM1.5G simulated solar illumination.

Inset: Surface morphology of the original substrate (a) after ELO and protection layer removal and (b) after the ELO without the protection layer.

The control(s) described herein, including for the data shown in FIG. 31, was prepared by etching away the entire wafer instead of using liftoff. This process is described in the paper, "K. T. Shiu, J. Zimmerman, H. Y. Wang and S. R. Forrest, "Ultrathin film, high specific power InP solar cells on flexible plastic substrates", Applied Physics Letters 95, 223503, (2009), which herein incorporated by reference.

Comparison of device performances under AM1.5G simulated solar spectrum, and the dark current at −1V ($J_D$), ideality factor (n) and specific series resistance ($R_S$) in the dark, after ELO of the first and second devices in FIG. 7A as compared to a control cell, is described in Table 2.

TABLE 2

| | $J_D$ (μA/cm$^2$) | n | $R_s$ (Ω-cm$^2$) | $J_{sc}$ (mA/cm$^2$) | $V_{oc}$ (V) | FF (%) | $\eta_p$ (%) |
|---|---|---|---|---|---|---|---|
| Previous work[a] | 1.6 | 1.14 | 5.4 | 29.6 ± 2.9 | 0.62 | 55 | 10.2 ± 1.0 |
| Control cell | 0.6 | 1.66 | 0.7 | 31.2 ± 1.0 | 0.71 | 64.3 ± 2.0 | 14.6 ± 0.3 |
| 1st ELO cell | 128 | 1.87 | 0.5 | 31.8 ± 0.1 | 0.70 | 64.4 ± 1.9 | 14.4 ± 0.4 |
| 2nd ELO cell | 17 | 1.71 | 0.7 | 31.3 ± 0.3 | 0.71 | 66.1 ± 0.3 | 14.8 ± 0.2 |

[a]As reported in Shiu et al., supra.

Other than in the examples, or where otherwise indicated, all numbers expressing quantities of ingredients, reaction conditions, analytical measurements, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

Other embodiments of the devices and methods described herein will be apparent to those skilled in the art from consideration of the specification and practice. It is intended that the specification and examples be considered as exemplary only, with the true scope of the devices and methods described being indicated by the claims.

What is claimed is:

1. A method of preserving the integrity of a growth substrate, comprising:
    providing a structure having a growth substrate with at least one growing surface; a cell; a sacrificial layer; a first protective layer; and a second protective layer, wherein the first protective layer is positioned above the growth substrate, the second protective layer is positioned above the first protective layer, and the sacrificial layer is positioned above the second protective layer, and wherein the sacrificial layer and the first and second protective layers are positioned between the growth substrate and the cell;
    releasing the cell by etching the sacrificial layer with an etchant;
    removing the second protective layer by etching the second protective layer with an etchant; and
    removing the first protective layer by etching the first protective layer with an etchant.

2. The method of claim 1, wherein the growth substrate and the second protective layer comprise the same material.

3. The method of claim 1, wherein the growth substrate is selected from Ge, Si, GaAs, InP, GaSb, GaN, AlN, and combinations thereof.

4. The method of claim 2, wherein the same material comprises InP.

5. The method of claim 2, wherein the same material comprises GaAs.

6. The method of claim 4, wherein the first protective layer is selected from InGaAs, InAlAs, (AlGa)AsSb, and combinations thereof.

7. The method of claim 5, wherein the first protective layer is selected from InGaP, AlGaAs, InAlP, and combinations thereof.

8. The method of claim 1, wherein the sacrificial layer comprises AlAs.

9. The method of claim 1, wherein each etchant is independently selected from HF, $H_3PO_4$, HCl, $H_2SO_4$, $HNO_3$, $C_6H_8O_7$ (citric acid), $H_2O_2$, and combinations thereof.

10. The method of claim 1, wherein the structure further comprises a buffer layer positioned between the cell and the growth substrate.

11. The method of claim 10, wherein the buffer layer is positioned between the growth substrate and the first protective layer.

12. The method of claim 10, wherein the growth substrate, the buffer layer, and the second protective layer comprise the same material.

13. The method of claim 12, wherein the same material comprises InP.

14. A method of preserving the integrity of a growth substrate, comprising:
    providing a growth substrate with at least one growing surface;
    depositing a first protective layer, a second protective layer, a sacrificial layer, and a cell over the growth substrate, wherein the second protective layer is positioned above the first protective layer, and the sacrificial layer is positioned above the second protective layer, and wherein the sacrificial layer and the first and second protective layers are positioned between the growth substrate and the cell;
    releasing the cell by etching the sacrificial layer with an etchant;
    removing the second protective layer by etching the second protective layer with an etchant; and
    removing the first protective layer by etching the first protective layer with an etchant.

15. The method of claim 14, further comprising depositing a buffer layer having a growing surface, wherein the buffer layer is positioned between the growth substrate and the cell.

16. The method of claim 15, wherein the at least one growing surface of the buffer layer, after removing the first protective layer, is smoother than the at least one growing surface of the growth substrate prior to depositing the first protective layer.

17. The method of claim 14, further comprising depositing a third protective layer and a fourth protective layer, wherein the third and fourth protective layers are deposited between the sacrificial layer and the cell.

18. A method of preparing a PV device comprising:
    providing a growth substrate;
    depositing a first protective layer, a second protective layer, a sacrificial layer, and at least one epilayer over the growth substrate, wherein the second protective layer is positioned above the first protective layer, and the sacrificial layer is positioned above the second protective layer, and wherein the sacrificial layer and the first and second protective layers are positioned between the growth substrate and the epilayer;

depositing at least one metal or alloy on at least a portion of said epilayer to form a contact layer;

bonding the contact layer to a metal or alloy-coated host substrate; and releasing the at least one epilayer by etching the sacrificial layer with an etchant.

19. The method of claim 18, further comprising removing the second protective layer by etching the second protective layer with an etchant, and removing the first protective layer by etching the first protective layer with an etchant.

* * * * *